(12) United States Patent
Itomi

(10) Patent No.: US 11,329,041 B2
(45) Date of Patent: May 10, 2022

(54) SEMICONDUCTOR INTEGRATED CIRCUIT, ELECTRONIC DEVICE AND VEHICLE

(71) Applicant: SEIKO EPSON CORPORATION, Tokyo (JP)

(72) Inventor: Noboru Itomi, Nirasaki (JP)

(73) Assignee: SEIKO EPSON CORPORATION, Tokyo (JP)

( * ) Notice: Subject to any disclaimer, the term of this patent is extended or adjusted under 35 U.S.C. 154(b) by 148 days.

(21) Appl. No.: 16/668,111

(22) Filed: Oct. 30, 2019

(65) Prior Publication Data
US 2020/0135731 A1    Apr. 30, 2020

(30) Foreign Application Priority Data

Oct. 31, 2018  (JP) .............................. JP2018-205039

(51) Int. Cl.
H01L 27/02    (2006.01)
H03K 17/693   (2006.01)
H01L 27/092   (2006.01)

(52) U.S. Cl.
CPC ........ H01L 27/092 (2013.01); H01L 27/0207 (2013.01); H03K 17/693 (2013.01)

(58) Field of Classification Search
CPC ............... H01L 27/092; H01L 27/0207; H01L 21/823493; H01L 21/823892; H01L 27/088; H03K 17/693
See application file for complete search history.

(56) References Cited

U.S. PATENT DOCUMENTS

| 5,247,301 A * | 9/1993 | Yahagi ................. H03M 1/146 341/156 |
| 6,567,024 B1 * | 5/2003 | Ishikawa ............ H03K 17/6874 341/136 |
| 2002/0089369 A1 * | 7/2002 | Ikeda ...................... H02M 3/07 327/536 |
| 2003/0146780 A1 * | 8/2003 | Chiba ...................... H03K 5/13 327/237 |
| 2003/0222679 A1 * | 12/2003 | Morikawa .............. H03K 3/012 326/83 |

(Continued)

FOREIGN PATENT DOCUMENTS

| JP | 2000-162281 A | 6/2000 |
| JP | 2005-223016 A | 8/2005 |
| JP | 2007-042872 A | 2/2007 |

*Primary Examiner* — Shahed Ahmed
*Assistant Examiner* — Khatib A Rahman
(74) *Attorney, Agent, or Firm* — Rankin, Hill & Clark LLP

(57) ABSTRACT

A semiconductor integrated circuit includes a first MOS transistor, a second MOS transistor, and a P+ region. The first MOS transistor is an NMOS transistor which has a first N-type region and a second N-type region and in which a first power supply voltage is supplied to the first N-type region. The second MOS transistor is an NMOS transistor which has a third N-type region and a fourth N-type region and in which a second power supply voltage higher than the first power supply voltage is supplied to the third N-type region. The P+ region is supplied with the first power supply voltage. In plan view of the semiconductor substrate, the first MOS transistor and the second MOS transistor are disposed to be adjacent to each other, and the P+ region is located between the first N-type region and the third N-type region.

11 Claims, 13 Drawing Sheets

(56) References Cited

U.S. PATENT DOCUMENTS

| | | | |
|---|---|---|---|
| 2004/0119522 A1* | 6/2004 | Tachibana | H03K 17/063 327/390 |
| 2010/0128008 A1* | 5/2010 | Qian | G11C 19/28 345/204 |
| 2012/0019969 A1* | 1/2012 | Iwabuchi | H03M 1/08 361/56 |
| 2015/0321574 A1* | 11/2015 | Oi | B60L 3/04 307/10.1 |

* cited by examiner

SEMICONDUCTOR INTEGRATED CIRCUIT, ELECTRONIC DEVICE AND VEHICLE

The present application is based on, and claims priority from JP Application Serial Number 2018-205039, filed Oct. 31, 2018, the disclosure of which is hereby incorporated by reference herein in its entirety.

BACKGROUND

1. Technical Field

The present disclosure relates to a semiconductor integrated circuit, an electronic device, and a vehicle.

2. Related Art

JP-A-2000-162281 discloses a semiconductor integrated circuit including: a D/A converter that outputs an analog voltage according to an input digital signal; and a test mode switch that is for outputting an analog voltage output from the D/A converter in a test mode from an output terminal.

JP-A-2000-162281 does not describe arrangement of analog switch circuits provided in test mode changeover switches and inverter circuits outputting signals for controlling analog switch circuits. Depending on the arrangement, when parasitic NPN transistors each of which is formed between a MOS transistor constituting a part of the analog switch circuit and a MOS transistor constituting a part of the inverter circuit are turned on, a path of absorption of external noise may be formed, and wiring on the path may be melted and disconnected.

SUMMARY

A semiconductor integrated circuit according to an aspect of the present disclosure includes: a semiconductor substrate; and a first MOS transistor, a second MOS transistor and a P+ region that are provided on the semiconductor substrate, in which the first MOS transistor is an NMOS transistor which has a first N-type region and a second N-type region and in which a first power supply voltage is supplied to the first N-type region, the second MOS transistor is an NMOS transistor which has a third N-type region and a fourth N-type region and in which a second power supply voltage higher than the first power supply voltage is supplied to the third N-type region, the P+ region is supplied with the first power supply voltage, and in plan view of the semiconductor substrate, the first MOS transistor and the second MOS transistor are disposed to be adjacent to each other, and the P+ region is located between the first N-type region and the third N-type region.

In the semiconductor integrated circuit according to the aspect of the present disclosure, in plan view of the semiconductor substrate, the fourth N-type region may be located between the first N-type region and the third N-type region.

A semiconductor integrated circuit according to an aspect of the present disclosure includes: a semiconductor substrate; and a first MOS transistor and a second MOS transistor that are provided on the semiconductor substrate, in which the first MOS transistor is an NMOS transistor which has a first N-type region and a second N-type region and in which a first power supply voltage is supplied to the first N-type region, the second MOS transistor is an NMOS transistor which has a third N-type region and a fourth N-type region and in which a second power supply voltage higher than the first power supply voltage is supplied to the third N-type region, and in plan view of the semiconductor substrate, the first MOS transistor and the second MOS transistor are disposed to be adjacent to each other, and the fourth N-type region is located between the first N-type region and the third N-type region.

The semiconductor integrated circuit according to the aspect of the present disclosure may further include: a third MOS transistor and a fourth MOS transistor that are provided on the semiconductor substrate, the third MOS transistor is an NMOS transistor which has a fifth N-type region and a sixth N-type region and in which the first power supply voltage is supplied to the fifth N-type region, the fourth MOS transistor is an NMOS transistor which has a seventh N-type region and an eighth N-type region and in which a third power supply voltage higher than the first power supply voltage is supplied to the seventh N-type region, and in plan view of the semiconductor substrate, the first MOS transistor and the third MOS transistor are disposed to be adjacent to each other, and the second MOS transistor and the fourth MOS transistor are disposed to be adjacent to each other, and the first N-type region and the third N-type region are located between the fifth N-type region and the seventh N-type region.

A semiconductor integrated circuit according to an aspect of the present disclosure includes: a semiconductor substrate; and a first MOS transistor, a second MOS transistor and an N+ region that are provided on the semiconductor substrate, in which the first MOS transistor is a PMOS transistor which has a first P-type region and a second P-type region, and in which a first power supply voltage is supplied to the first P-type region, the second MOS transistor is a PMOS transistor which has a third P-type region and a fourth P-type region and in which a second power supply voltage lower than the first power supply voltage is supplied to the third P-type region, the N+ region is supplied with the second power supply voltage, and in plan view of the semiconductor substrate, the first MOS transistor and the second MOS transistor are disposed to be adjacent to each other, and the N+ region is located between the first P-type region and the third P-type region.

In the semiconductor integrated circuit according to the aspect of the present disclosure, in plan view of the semiconductor substrate, the fourth P-type region may be located between the first P-type region and the third P-type region.

A semiconductor integrated circuit according to an aspect of the present disclosure includes: a semiconductor substrate; and a first MOS transistor and a second MOS transistor that are provided on the semiconductor substrate, in which the first MOS transistor is a PMOS transistor which has a first P-type region and a second P-type region, and in which a first power supply voltage is supplied to the first P-type region, the second MOS transistor is a PMOS transistor which has a third P-type region and a fourth P-type region and in which a second power supply voltage lower than the first power supply voltage is supplied to the third P-type region, in plan view of the semiconductor substrate, the first MOS transistor and the second MOS transistor are disposed to be adjacent to each other, and the fourth P-type region is located between the first P-type region and the third P-type region.

The semiconductor integrated circuit according to the aspect of the present disclosure may further include: a third MOS transistor and a fourth MOS transistor that are provided on the semiconductor substrate, the third MOS transistor is a PMOS transistor which has a fifth P-type region and a sixth P-type region and in which the first power supply voltage is supplied to the fifth P-type region, the fourth MOS transistor is a PMOS transistor which has a seventh P-type region and an eighth P-type region and in which a third power supply voltage lower than the first power supply voltage is supplied to the seventh P-type region, in plan view of the semiconductor substrate, the first MOS transistor and the third MOS transistor are disposed to be adjacent to each other, and the second MOS transistor and the fourth MOS transistor are disposed to be adjacent to each other, and the first P-type region and the third P-type region are located between the fifth P-type region and the seventh P-type region.

The semiconductor integrated circuit according to the aspect of the present disclosure may further include: a fifth MOS transistor; and a sixth MOS transistor, an inverter circuit includes the first MOS transistor and the fifth MOS transistor, and an analog switch circuit includes the second MOS transistor and the sixth MOS transistor.

An electronic device according to an aspect of the present disclosure includes the semiconductor integrated circuit according to the aspect of the present disclosure.

A vehicle according to an aspect of the present disclosure includes the semiconductor integrated circuit according to the aspect of the present disclosure.

DESCRIPTION OF EXEMPLARY EMBODIMENTS

Hereinafter, preferred embodiments of the present disclosure will be described in detail with reference to the drawings. The embodiments described below do not unduly limit contents of the present disclosure described in the appended claims. Further, all of the configurations described below are not necessarily essential configuration requirements of the present disclosure.

1. Semiconductor Integrated Circuit 1-1. First Embodiment

Figure 1:
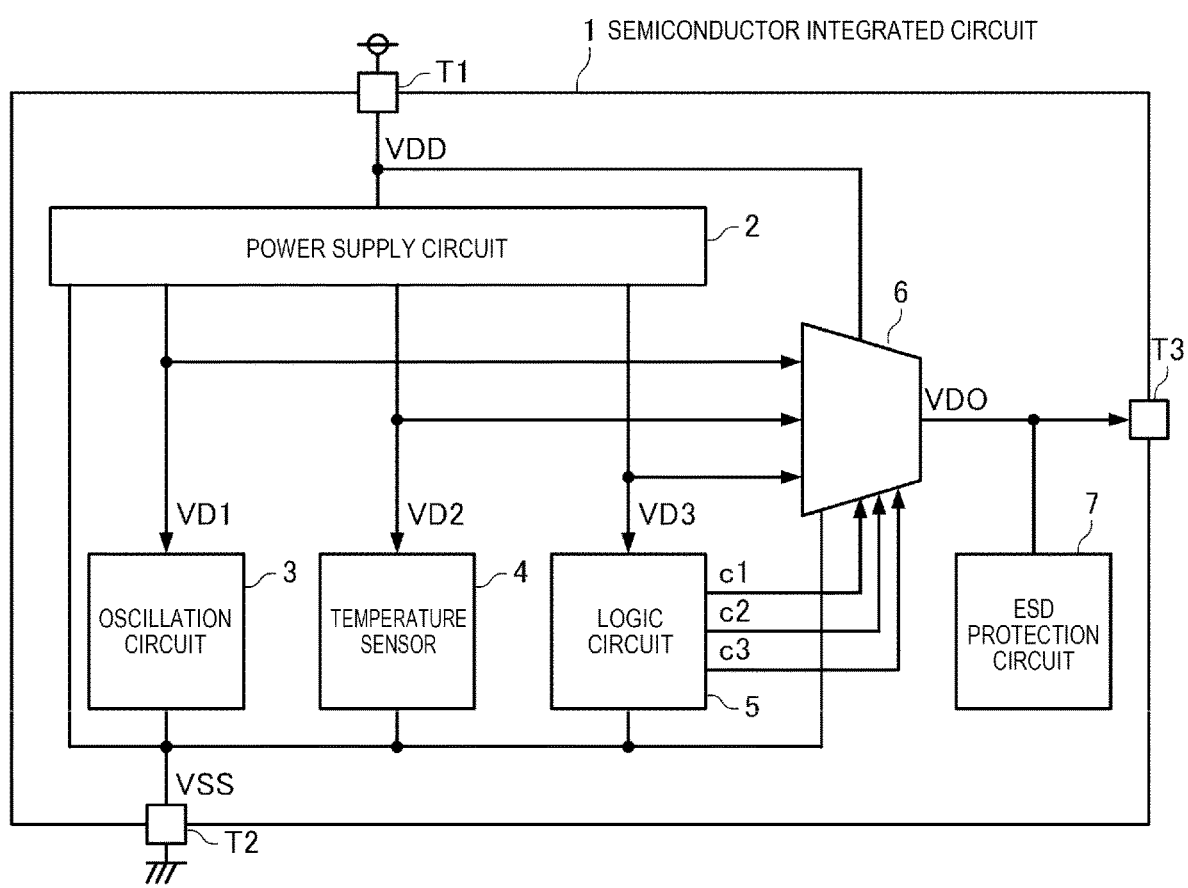
FIG. 1 is a diagram illustrating an example of functional blocks of a semiconductor integrated circuit according to a present embodiment.

FIG. 1 is a diagram illustrating an example of a functional block of the semiconductor integrated circuit of the present embodiment. As illustrated in FIG. 1, the semiconductor integrated circuit 1 of the present embodiment includes, for example, a power supply circuit 2, an oscillation circuit 3, a temperature sensor 4, a logic circuit 5, a selector 6, and an ESD protection circuit 7.

The power supply circuit 2 generates a power supply voltage VD1 of the oscillation circuit 3, a power supply voltage VD2 of the temperature sensor 4, a power supply voltage VD3 of the logic circuit 5, and the like, based on power supply voltage VDD supplied from an external terminal T1 of the semiconductor integrated circuit 1 with reference to a power supply voltage VSS supplied from an external terminal T2 of the semiconductor integrated circuit 1. The power supply voltage VDD is higher than the power supply voltage VSS, and the power supply voltage VSS is, for example, a ground voltage of 0V. The power supply voltages VD1, VD2, and VD3 are voltages higher than the power supply voltage VSS and lower than the power supply voltage VDD.

The oscillation circuit 3 is a circuit operating by being supplied with the power supply voltage VD1 and the power supply voltage VSS so as to output an oscillation signal. For example, the oscillation circuit 3 may be a circuit that is electrically connected to both ends of a resonator not shown in the drawing so as to oscillate the resonator by amplifying the output signal of the resonator and feeding the signal back to the resonator. As this resonator, for example, it is possible to use a quartz crystal resonator, a surface acoustic wave (SAW) resonance element, another piezoelectric vibration element, a micro electro mechanical systems (MEMS) resonator, or the like. Further, for example, the oscillation circuit may be an LC oscillation circuit or a CR oscillation circuit.

The temperature sensor 4 operates by being supplied with the power supply voltage VD2 and the power supply voltage VSS, detects the temperature of the semiconductor integrated circuit 1, and outputs a temperature signal of a voltage according to the temperature. For example, the temperature sensor 4 is realized by a temperature sensor or the like using temperature characteristics of a band gap reference circuit.

The logic circuit 5 operates by being supplied with the power supply voltage VD3 and the power supply voltage VSS, and generates control signals c1, c2, c3, and the like for controlling the selector 6.

The selector 6 operates by being supplied with the power supply voltage VDD and the power supply voltage VSS, selects any one of the power supply voltage VD1, the power supply voltage VD2, and the power supply voltage VD3 according to the logic levels of the control signals c1, c2, and c3, and outputs the voltage as the power supply voltage VDO. In the present embodiment, the control signals c1, c2, and c3 are mutually exclusive at the high level. The selector 6 selects the power supply voltage VD1 when the control signal c1 is at the high level, selects the power supply voltage VD2 when the control signal c2 is at the high level, and selects the power supply voltage VD3 when the control signal c3 is at the high level. The power supply voltage VDO, which is output from the selector 6, is output from the external terminal T3 of the semiconductor integrated circuit 1 to the outside of the semiconductor integrated circuit 1. Although not illustrated in FIG. 1, for example, the semiconductor integrated circuit 1 may output the power supply voltage VDO, which is output from the selector 6, from the external terminal T3 in a predetermined test mode.

The ESD protection circuit 7 is a circuit that guides external noise, which is an input from the external terminal T3, to a power supply line not shown in the drawing and electrically connected to the external terminal T1 or a ground line not shown in the drawing and electrically connected to the external terminal T2 and that protects the power supply circuit 2, the oscillation circuit 3, the temperature sensor 4, the logic circuit 5, and the selector 6 from the external noise. It is preferable that the ESD protection circuit 7 is provided to be closer to the external terminal T3 than the selector 6.

Figure 2:
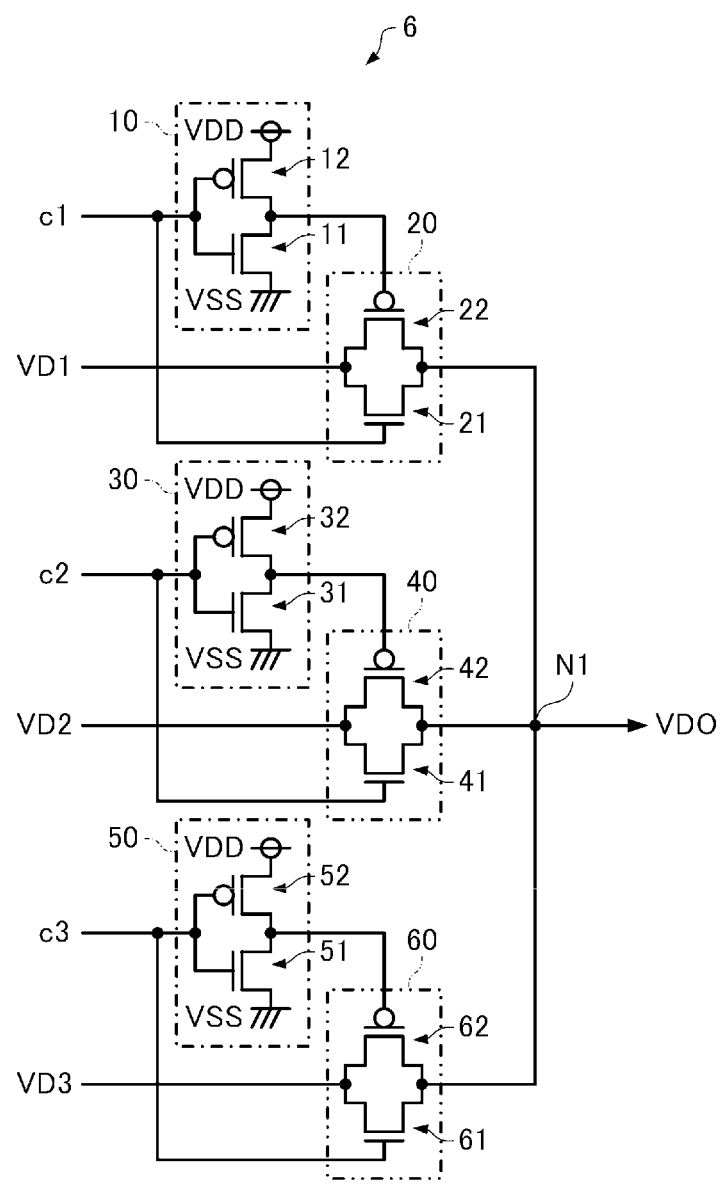
FIG. 2 is a diagram illustrating an example of a configuration of a selector.

FIG. 2 is a diagram illustrating a configuration example of the selector 6. As illustrated in FIG. 2, the selector 6 includes NMOS transistors 11, 21, 31, 41, 51, and 61 and PMOS transistors 12, 22, 32, 42, 52, and 62, and operates by being supplied with the power supply voltage, for example, from the outside of the semiconductor integrated circuit 1.

A source of the NMOS transistor 11 is supplied with the power supply voltage VSS, and a source of the PMOS transistor 12 is supplied with the power supply voltage VDD. A gate of the NMOS transistor 11 and a gate of the PMOS transistor 12 are supplied with the control signal c1. A drain of the NMOS transistor 11 and a drain of the PMOS transistor 12 are electrically connected to a gate of the PMOS transistor 22.

A source of the NMOS transistor 31 is supplied with the power supply voltage VSS, and a source of the PMOS transistor 32 is supplied with the power supply voltage VDD. A gate of the NMOS transistor 31 and a gate of the PMOS transistor 32 are supplied with the control signal c2. A drain of the NMOS transistor 31 and a drain of the PMOS transistor 32 are electrically connected to a gate of the PMOS transistor 42.

A source of the NMOS transistor 51 is supplied with the power supply voltage VSS, and a source of the PMOS transistor 52 is supplied with the power supply voltage VDD. A gate of the NMOS transistor 51 and a gate of the PMOS transistor 52 are supplied with the control signal c3. A drain of the NMOS transistor 51 and a drain of the PMOS transistor 52 are electrically connected to a gate of the PMOS transistor 62.

A drain of the NMOS transistor 21 and a source of the PMOS transistor 22 are supplied with the power supply voltage VD1. A drain of the NMOS transistor 41 and a source of the PMOS transistor 42 are supplied with the power supply voltage VD2. A drain of the NMOS transistor 61 and a source of the PMOS transistor 62 are supplied with the power supply voltage VD3. The sources of the NMOS transistors 21, 41, and 61 and the drains of the PMOS transistors 22, 42, and 62 are electrically connected to each other and are set as a node N1, and the power supply voltage VDO is output from the node N1. The node N1 is a node electrically connected to the external terminal T3 of FIG. 1.

The NMOS transistor 11 and the PMOS transistor 12 constitute an inverter circuit 10. Further, the NMOS transistor 31 and the PMOS transistor 32 constitute an inverter circuit 30. Further, the NMOS transistor 51 and the PMOS transistor 52 constitute an inverter circuit 50. Further, the NMOS transistor 21 and the PMOS transistor 22 constitute an analog switch circuit 20. Further, the NMOS transistor 41 and the PMOS transistor 42 constitute an analog switch circuit 40. Further, the NMOS transistor 61 and the PMOS transistor 62 constitute an analog switch circuit 60.

In the selector 6, when the control signal c1 is at the high level and both the control signals c2 and c3 are at the low level, the NMOS transistor 21 is on, and both of the NMOS transistors 41 and 61 are off. Further, since the output signal of the inverter circuit 10 is at the low level and both of the output signals of the inverter circuits 30 and 50 are at the high level, the PMOS transistor 22 is on, and both of the PMOS transistors 42 and 62 are off. As a result, the power supply voltage VD1 passes through the analog switch circuit 20, whereas the power supply voltages VD2 and VD3 are not capable of passing through the analog switch circuits 40 and 60, respectively, and the power supply voltage VDO becomes the power supply voltage VD1.

When the control signal c2 is at the high level and both the control signals c1 and c3 are at the low level, the NMOS transistor 41 is on, and both of the NMOS transistors 21 and 61 are off. Further, since the output signal of the inverter circuit 30 is at the low level and both of the output signals of the inverter circuits 10 and 50 are at the high level, the PMOS transistor 42 is on, and both of the PMOS transistors 22 and 62 are off. As a result, the power supply voltage VD2 passes through the analog switch circuit 40, whereas the power supply voltages VD1 and VD3 are not capable of passing through the analog switch circuits 20 and 60, respectively, and the power supply voltage VDO becomes the power supply voltage VD2.

When the control signal c3 is at the high level and both the control signals c1 and c2 are at the low level, the NMOS transistor 61 is on, and both of the NMOS transistors 21 and 41 are off. Further, since the output signal of the inverter circuit 50 is at the low level and both of the output signals of the inverter circuits 10 and 30 are at the high level, the PMOS transistor 62 is on, and both of the PMOS transistors 22 and 42 are off. As a result, the power supply voltage VD3 passes through the analog switch circuit 60, whereas the power supply voltages VD1 and VD2 are not capable of passing through the analog switch circuits 20 and 40, respectively, and the power supply voltage VDO becomes the power supply voltage VD3.

Figure 3:
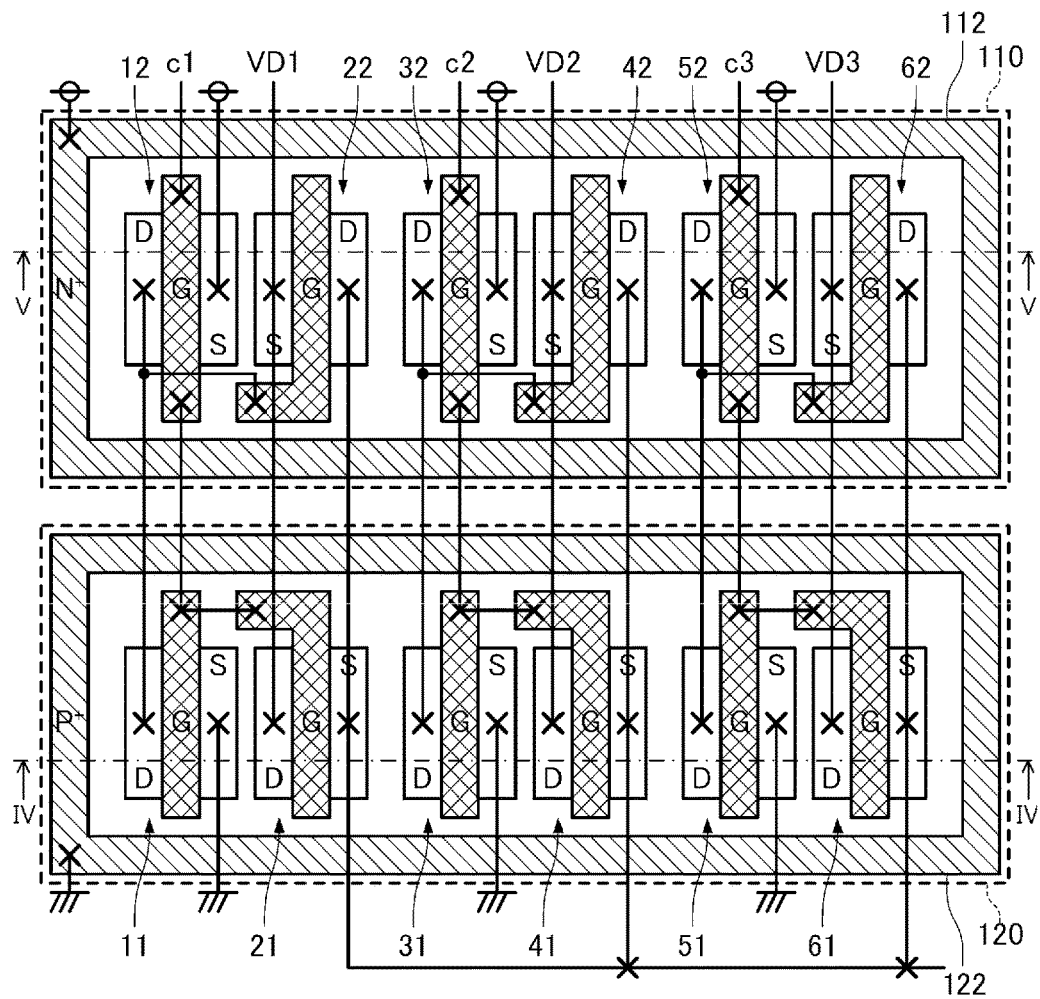
FIG. 3 is a diagram illustrating a comparative example of arrangement of MOS transistors constituting a selector.
Figure 4:
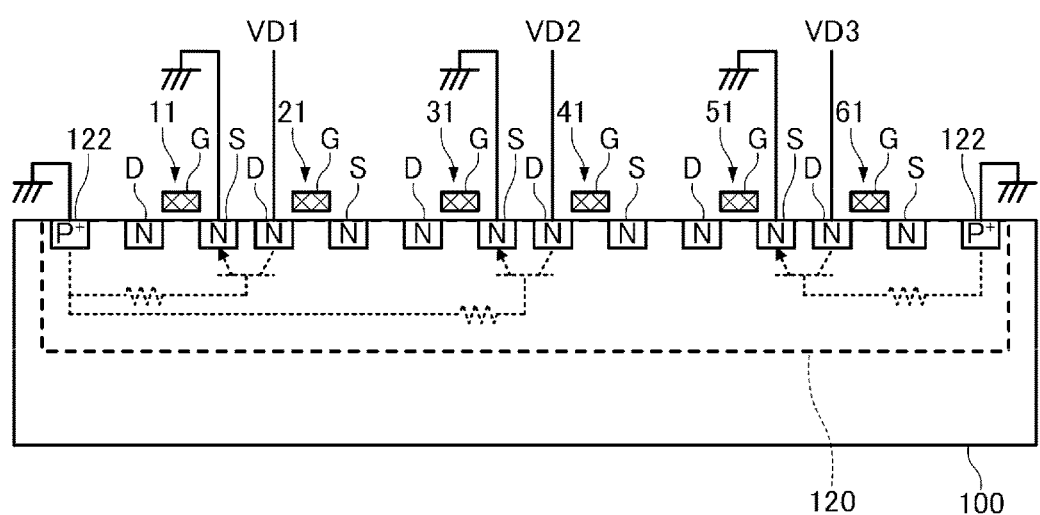
FIG. 4 is a cross-sectional view of an arrangement region of the NMOS transistors of FIG. 3 taken along the line IV-IV.
Figure 5:
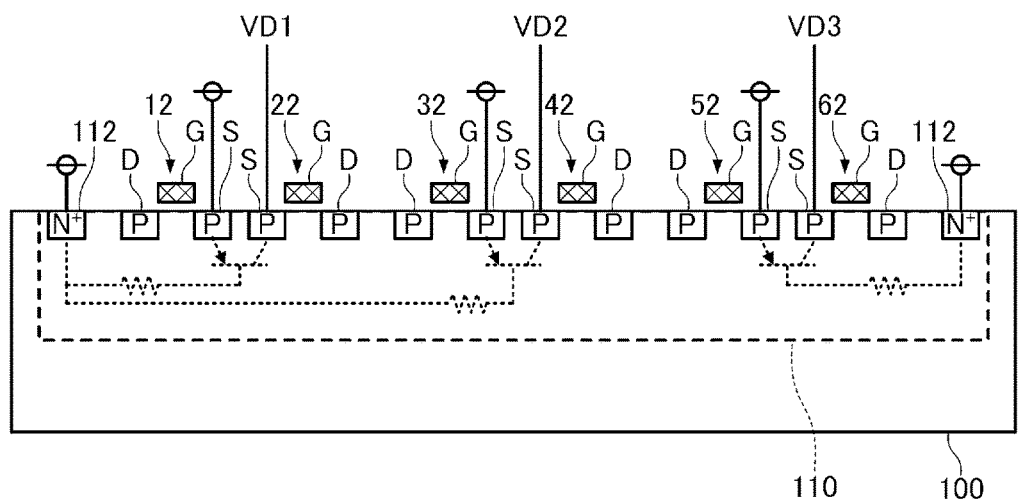
FIG. 5 is a cross-sectional view of an arrangement region of the PMOS transistors of FIG. 3 taken along the line V-V.

The semiconductor integrated circuit 1 including the selector 6 having such a configuration is formed on a semiconductor substrate such as a silicon substrate. According to the arrangement of the MOS transistors constituting the selector 6 on the semiconductor substrate, a phenomenon may occur in which some of the MOS transistors are broken by large external noise which is an input from the external terminal T3. FIGS. 3, 4, and 5 each show an example of arrangement of the MOS transistors in which this phenomenon can occur as a comparative example. FIG. 3 is a diagram illustrating the arrangement of the MOS transistors constituting the selector 6 when a semiconductor substrate 100 is viewed in plan. FIG. 4 is a cross-sectional view of the arrangement region of the NMOS transistors illustrated in FIG. 3 taken along the line IV-IV. FIG. 5 is a cross-sectional view of the arrangement region of the PMOS transistors illustrated in FIG. 3 taken along the line V-V. In addition, in FIG. 3, the wiring connecting the MOS transistors is denoted by a line segment, and the contact is denoted by x. Further, wiring is omitted in FIGS. 4 and 5. In FIGS. 3, 4, and 5, the letters G, S, and D are attached to the gate, source, and drain of each MOS transistor. It should be noted that FIGS. 3, 4, and 5 are conceptual diagrams for the following description, and there may be addition or deletion of components.

In the comparative example illustrated in FIGS. 3, 4, and 5, an N well 110 as an N-type layer is formed in the semiconductor substrate 100. An impurity such as phosphorus or arsenic is implanted into the N-type layer. An N+ region 112 is formed around the N well 110. The N+ region 112 is an N-type region having a higher impurity concentration than that of the surroundings. The N+ region 112 is supplied with the power supply voltage VDD. Further, in the semiconductor substrate 100, a P well 120 as a P-type layer is formed in the vicinity of the N well 110. Boron or impurities of boron and the like are implanted into the P-type layer. A P+ region 122 is formed around the P well 120. The P+ region 122 is a P-type region having a higher impurity concentration than that of the surroundings. The P+ region 122 is supplied with the power supply voltage VSS.

The NMOS transistors 11, 21, 31, 41, 51, and 61 are formed inside the P+ region 122 in the P well 120, and the PMOS transistors 12, 22, 32, 42, 52, and 62 are formed inside the N+ region 112 in the N well 110. In each of the NMOS transistors 11, 21, 31, 41, 51, and 61, the gate is a region formed of polysilicon or the like, and the source and drain are N-type regions. Further, in each of the PMOS transistors 12, 22, 32, 42, 52, and 62, the gate is a region formed of polysilicon or the like, and the source and drain are P-type regions.

In the comparative example, as illustrated in FIG. 3, the NMOS transistor 11 and the NMOS transistor 21 are disposed to be adjacent to each other in plan view of the semiconductor substrate 100. Specifically, the source of the NMOS transistor 11 and the drain of the NMOS transistor 21 are disposed to be adjacent to each other. Therefore, as illustrated in FIG. 4, parasitic NPN transistors are formed in which the source of the NMOS transistor 11, the P well 120, and the drain of the NMOS transistor 21 serve as an emitter, a base, and a collector, respectively.

Similarly, the NMOS transistor 31 and the NMOS transistor 41 are disposed to be adjacent to each other in plan view of the semiconductor substrate 100. Specifically, the source of the NMOS transistor 31 and the drain of the NMOS transistor 41 are disposed to be adjacent to each other. Therefore, parasitic NPN transistors are formed in which the source of the NMOS transistor 31, the P well 120, and the drain of the NMOS transistor 41 serve as an emitter, a base, and a collector, respectively.

Similarly, the NMOS transistor 51 and the NMOS transistor 61 are disposed to be adjacent to each other in plan view of the semiconductor substrate 100. Specifically, the source of the NMOS transistor 51 and the drain of the NMOS transistor 61 are disposed to be adjacent to each other. Therefore, parasitic NPN transistors are formed in which the source of the NMOS transistor 51, the P well 120, and the drain of the NMOS transistor 61 serve as an emitter, a base, and a collector, respectively.

As described above, the sources of the NMOS transistors 11, 31, and 51 are supplied with the power supply voltage VSS, and the drains of the NMOS transistors 21, 41, and 61 are supplied with the power supply voltages VD1, VD2, and VD3 higher than the power supply voltage VSS, respectively. Therefore, in each of the parasitic three NPN transistors, a potential of the collector is higher than a potential of the emitter. Further, although the P+ region 122 is supplied with the power supply voltage VSS, the resistance component of the P well 120 makes the potential of the base of each NPN transistor higher than the power supply voltage VSS. Therefore, in each NPN transistor, a potential of the base is higher than a potential of the emitter. As a result, each NPN transistor may be turned on and current may flow from the collector to the emitter. Therefore, when large external noise such as static electricity at a voltage higher than the power supply voltage VDD is applied to the external terminal T3, a large current is likely to flow from the external terminal T3 to the ground through the PMOS transistors 22, 42, and 62 and the NPN transistors each of which has a current drive capability higher than that of the ESD protection circuit 7 illustrated in FIG. 1. As a result, when a large current exceeding the withstand voltage flows, each MOS transistor is broken.

In the comparative example, as illustrated in FIG. 3, the PMOS transistor 12 and the PMOS transistor 22 are disposed to be adjacent to each other in plan view of the semiconductor substrate 100. Specifically, the source of the PMOS transistor 12 and the source of the PMOS transistor 22 are disposed to be adjacent to each other. Therefore, as illustrated in FIG. 5, parasitic PNP transistors are formed in which the source of the PMOS transistor 12, the N well 110, and the source of the PMOS transistor 22 serve as an emitter, a base, and a collector, respectively.

Similarly, the PMOS transistor 32 and the PMOS transistor 42 are disposed to be adjacent to each other in plan view of the semiconductor substrate 100. Specifically, the source of the PMOS transistor 32 and the source of the PMOS transistor 42 are disposed to be adjacent to each other. Therefore, parasitic PNP transistors are formed in which the source of the PMOS transistor 32, the N well 110, and the source of the PMOS transistor 42 serve as an emitter, a base, and a collector, respectively.

Similarly, the PMOS transistor 52 and the PMOS transistor 62 are disposed to be adjacent to each other in plan view of the semiconductor substrate 100. Specifically, the source of the PMOS transistor 52 and the source of the PMOS transistor 62 are disposed to be adjacent to each other. Therefore, parasitic PNP transistors are formed in which the source of the PMOS transistor 52, the N well 110, and the source of the PMOS transistor 62 serve as an emitter, a base, and a collector, respectively.

As described above, the sources of the PMOS transistors 12, 32, and 52 are supplied with the power supply voltage VDD, and the sources of the PMOS transistors 22, 42, and 62 are supplied with the power supply voltages VD1, VD2, and VD3 lower than the power supply voltage VDD, respectively. Therefore, in each of the three parasitic PNP transistors, a potential of the emitter is higher than a potential of the collector. Further, although the power supply voltage VDD is supplied to the N+ region 112, the resistance component of the N well 110 makes a potential at the base of each PNP transistor lower than the power supply voltage VDD. Therefore, in each PNP transistor, a potential of the emitter is higher than a potential of the base. As a result, each PNP transistor may be turned on, and current may flow from the emitter to the collector. Therefore, when large external noise such as static electricity at a voltage lower than the power supply voltage VSS is applied to the external terminal T3, a large current is likely to flow from the power supply to the external terminal T3 through the NMOS transistors 21, 41, and 61 and the PNP transistors each of which has a current drive capability higher than that of the ESD protection circuit 7. As a result, when a large current exceeding the withstand voltage flows, each MOS transistor is broken.

Figure 6:
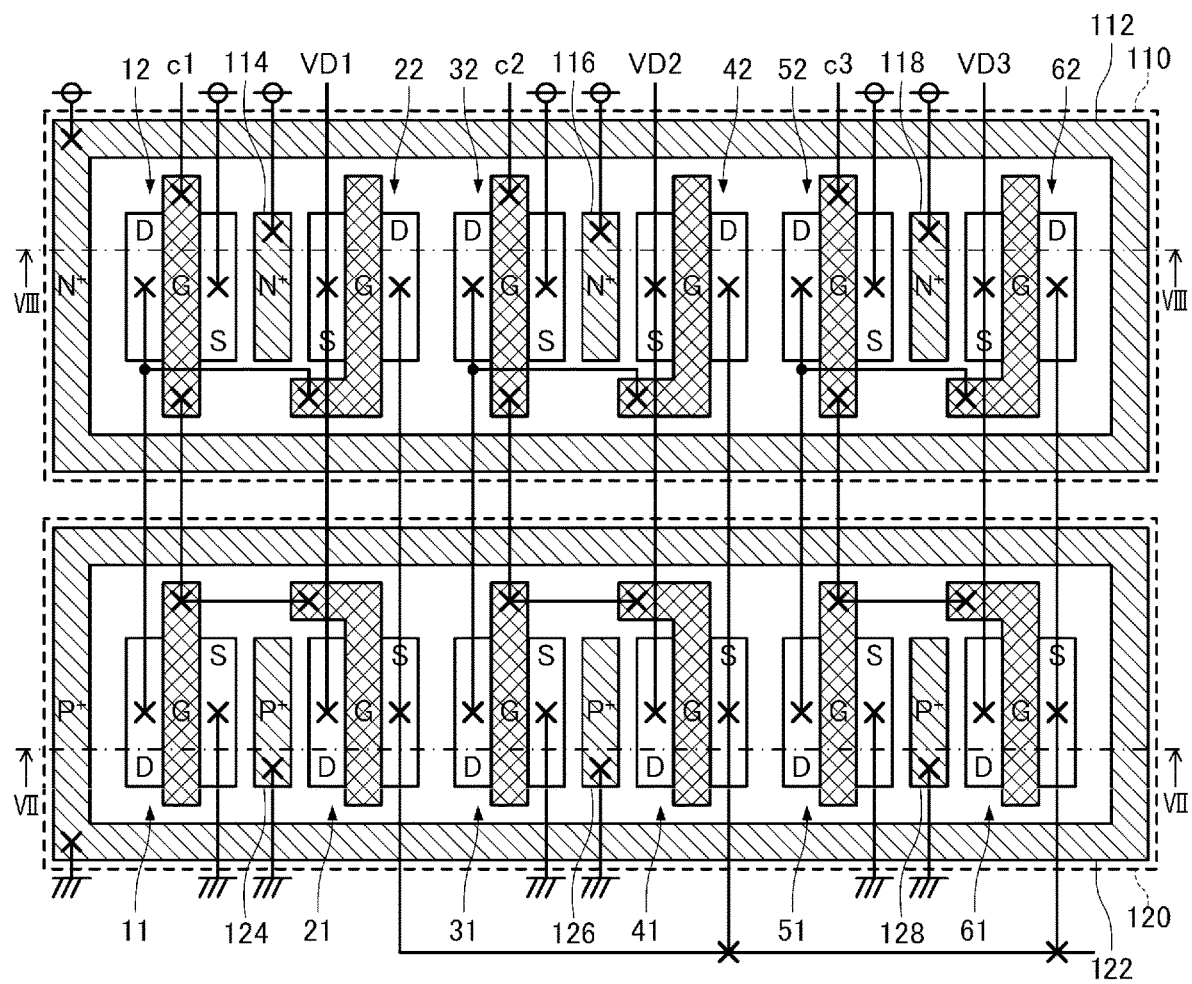
FIG. 6 is a diagram illustrating an example of arrangement of MOS transistors constituting a selector in a first embodiment.
Figure 7:
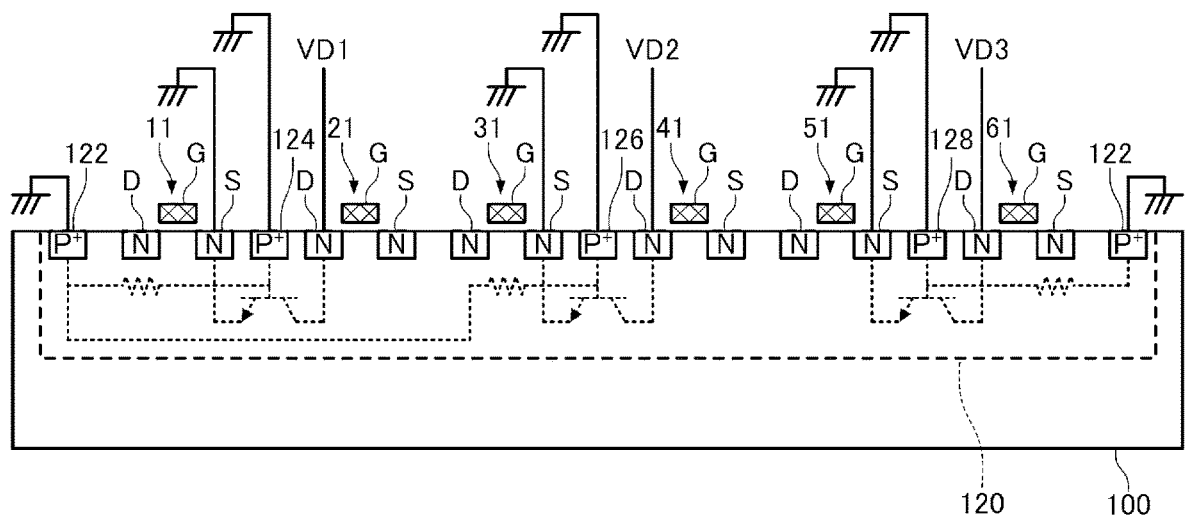
FIG. 7 is a cross-sectional view of an arrangement region of the NMOS transistors of FIG. 6 taken along the line VII-VII.
Figure 8:
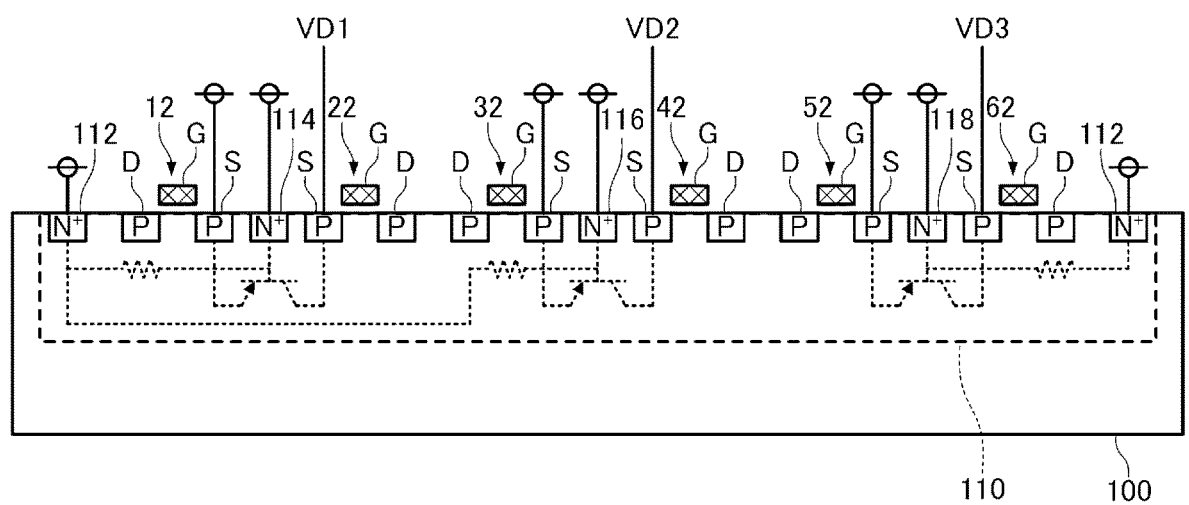
FIG. 8 is a cross-sectional view of an arrangement region of the PMOS transistors of FIG. 6 taken along the line VIII-VIII.

Therefore, in the present embodiment, arrangement of the MOS transistors constituting the selector 6 is devised such that each parasitic NPN transistor and each parasitic PNP transistor are not turned on. FIGS. 6, 7, and 8 show an example of the arrangement. FIG. 6 is a diagram illustrating the arrangement of the MOS transistors constituting the selector 6 when the semiconductor substrate 100 is viewed in plan. FIG. 7 is a cross-sectional view of the arrangement region of the NMOS transistors illustrated in FIG. 6 taken along the line VII-VII. FIG. 8 is a cross-sectional view of the arrangement region of the PMOS transistors illustrated in FIG. 6 taken along the line VIII-VIII. In addition, in FIG. 6, the wiring connecting the MOS transistors is denoted by a line segment, and the contact is denoted by x. Further, wiring is omitted in FIGS. 7 and 8. In FIGS. 6, 7, and 8, the letters G, S, and D are attached to the gate, source, and drain of each MOS transistor. It should be noted that FIGS. 6, 7, and 8 are conceptual diagrams for the following description, and there may be addition or deletion of components.

In the example of arrangement in the present embodiment, three P+ regions 124, 126, and 128 supplied with the power supply voltage VSS are provided inside the P+ region 122 in the P well 120. The P+ regions 124, 126, and 128 are P-type regions of which impurity concentrations are higher than that of the surroundings.

In the example of arrangement in the present embodiment, as illustrated in FIG. 6, the NMOS transistor 11 and the NMOS transistor 21 are disposed to be adjacent to each other in plan view of the semiconductor substrate 100. Specifically, the source of the NMOS transistor 11 and the drain of the NMOS transistor 21 are disposed to be adjacent to each other. The P+ region 124 is located between the source of the NMOS transistor 11 and the drain of the NMOS transistor 21 in plan view of the semiconductor substrate 100. Therefore, as illustrated in FIG. 7, parasitic NPN transistors are formed in which the source of the NMOS transistor 11, the P+ region 124, and the drain of the NMOS transistor 21 serve as an emitter, a base, and a collector, respectively.

Similarly, the NMOS transistor 31 and the NMOS transistor 41 are disposed to be adjacent to each other in plan view of the semiconductor substrate 100. Specifically, the source of the NMOS transistor 31 and the drain of the NMOS transistor 41 are disposed to be adjacent to each other. The P+ region 126 is located between the source of the NMOS transistor 31 and the drain of the NMOS transistor 41 in plan view of the semiconductor substrate 100. Therefore, parasitic NPN transistors are formed in which the source of the NMOS transistor 31, the P+ region 126, and the drain of the NMOS transistor 41 serve as an emitter, a base, and a collector, respectively.

Similarly, the NMOS transistor 51 and the NMOS transistor 61 are disposed to be adjacent to each other in plan view of the semiconductor substrate 100. Specifically, the source of the NMOS transistor 51 and the drain of the NMOS transistor 61 are disposed to be adjacent to each other. The P+ region 128 is located between the source of the NMOS transistor 51 and the drain of the NMOS transistor 61 in plan view of the semiconductor substrate 100. Therefore, parasitic NPN transistors are formed in which the source of the NMOS transistor 51, the P+ region 128, and the drain of the NMOS transistor 61 serve as an emitter, a base, and a collector, respectively.

As described above, the sources of the NMOS transistors 11, 31, and 51 are supplied with the power supply voltage VSS, and the drains of the NMOS transistors 21, 41 and 61 are supplied with the power supply voltages VD1, VD2, and VD3 higher than the power supply voltage VSS, respectively. Therefore, in each of the parasitic three NPN transistors, a potential of the collector is higher than a potential of the emitter. However, since the power supply voltage VSS is supplied to the P+ regions 124, 126, and 128, the potential difference between the base and the emitter of each NPN transistor becomes zero, and no current flows from the base of each NPN transistor to the P+ region 122 through the resistance component of the P well 120. Therefore, each NPN transistor is turned off, and no current flows from the collector to the emitter. Therefore, when large external noise such as static electricity having a voltage higher than the power supply voltage VDD is applied to the external terminal T3, a large current flows from the external terminal T3 to the ground through the ESD protection circuit 7. That is, the selector 6 is protected by the ESD protection circuit 7, and the possibility that the MOS transistors each having a low withstand voltage and constituting the selector 6 are broken is reduced.

In the example of arrangement in the present embodiment, three N+ regions 114, 116, and 118 supplied with the power supply voltage VDD are provided inside the N+ region 112 in the N well 110. The N+ regions 114, 116, and 118 are N-type regions of which impurity concentrations are higher than that of the surroundings.

In the example of arrangement in the present embodiment, as illustrated in FIG. 6, the PMOS transistor 12 and the PMOS transistor 22 are disposed to be adjacent to each other in plan view of the semiconductor substrate 100. Specifically, the source of the PMOS transistor 12 and the source of the PMOS transistor 22 are disposed to be adjacent to each other. The N+ region 114 is located between the source of the PMOS transistor 12 and the source of the PMOS transistor 22 in plan view of the semiconductor substrate 100. Therefore, as illustrated in FIG. 8, parasitic PNP transistors are formed in which the source of the PMOS transistor 12, the N+ region 114, and the source of the PMOS transistor 22 serve as an emitter, a base, and a collector, respectively.

Similarly, the PMOS transistor 32 and the PMOS transistor 42 are disposed to be adjacent to each other in plan view of the semiconductor substrate 100. Specifically, the source of the PMOS transistor 32 and the source of the PMOS transistor 42 are disposed to be adjacent to each other. The N+ region 116 is located between the source of the PMOS transistor 32 and the source of the PMOS transistor 42. Therefore, parasitic PNP transistors are formed in which the source of the PMOS transistor 32, the N+ region 116, and the source of the PMOS transistor 42 serve as an emitter, a base, and a collector, respectively.

Similarly, the PMOS transistor 52 and the PMOS transistor 62 are disposed to be adjacent to each other in plan view of the semiconductor substrate 100. Specifically, the source of the PMOS transistor 52 and the source of the PMOS transistor 62 are disposed to be adjacent to each other. The N+ region 118 is located between the source of the PMOS transistor 52 and the source of the PMOS transistor 62. Therefore, parasitic PNP transistors are formed in which the source of the PMOS transistor 52, the N+ region 118, and the source of the PMOS transistor 62 serve as an emitter, a base, and a collector, respectively.

As described above, the sources of the PMOS transistors 12, 32, and 52 are supplied with the power supply voltage VDD, and the sources of the PMOS transistors 22, 42 and 62 are supplied with the power supply voltages VD1, VD2, and VD3 lower than the power supply voltage VDD, respectively. Therefore, in each of the three parasitic PNP transistors, a potential of the emitter is higher than a potential of the collector. However, since the power supply voltage VDD is supplied to the N+ regions 114, 116, and 118, the potential difference between the emitter and the base of each PNP transistor becomes zero, and no current flows from the N+ region 112 to the base of each PNP transistor through the resistance component of the N well 110. Therefore, each PNP transistor is turned off, and no current flows from the emitter to the collector. Therefore, when large external noise such as static electricity having a voltage lower than the power supply voltage VSS is applied to the external terminal T3, a large current flows from the power supply to the external terminal T3 through the ESD protection circuit 7. That is, the selector 6 is protected by the ESD protection circuit 7, and the possibility that the MOS transistors each having a low withstand voltage and constituting the selector 6 are broken is reduced.

1-2. Second Embodiment

The semiconductor integrated circuit 1 of the second embodiment is the same as the semiconductor integrated circuit 1 of the first embodiment except for the arrangement of the MOS transistors constituting the selector 6. Hereinafter, in the semiconductor integrated circuit 1 of the second embodiment, the same components as those in the first embodiment are denoted by the same reference numerals, the contents different from the first embodiment will be described, and the redundant contents will be omitted.

Figure 9:
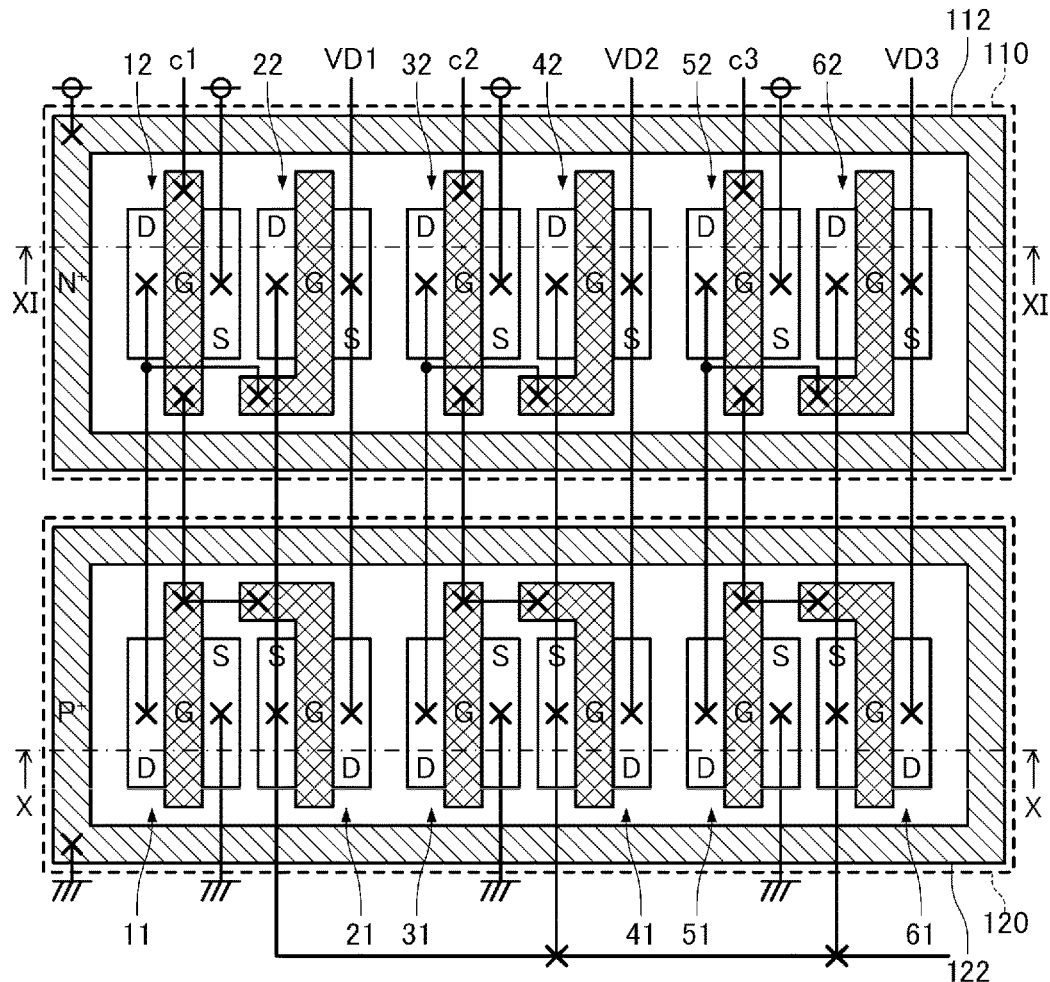
FIG. 9 is a diagram illustrating an example of arrangement of MOS transistors constituting a selector in a second embodiment.
Figure 10:
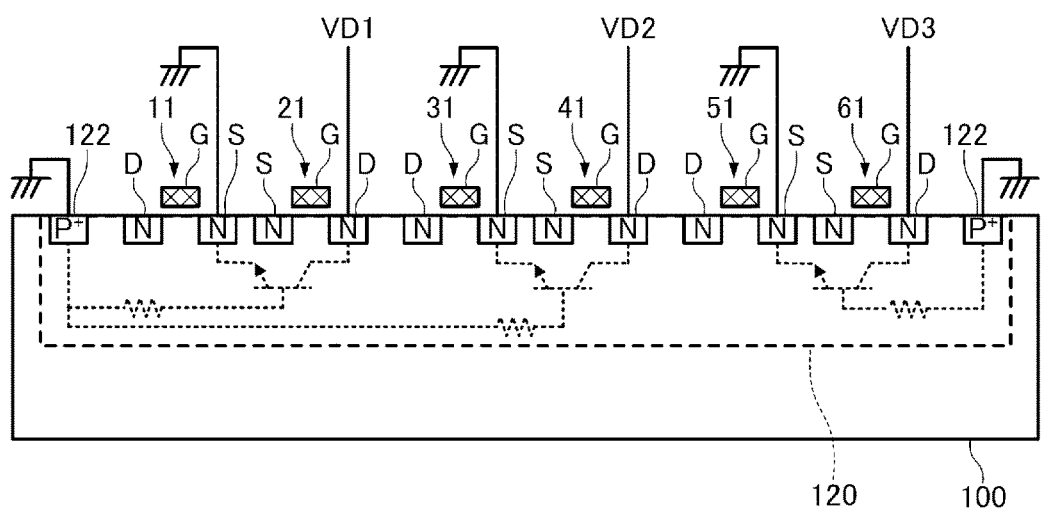
FIG. 10 is a cross-sectional view of an arrangement region of the NMOS transistors of FIG. 9 taken along the line X-X.
Figure 11:
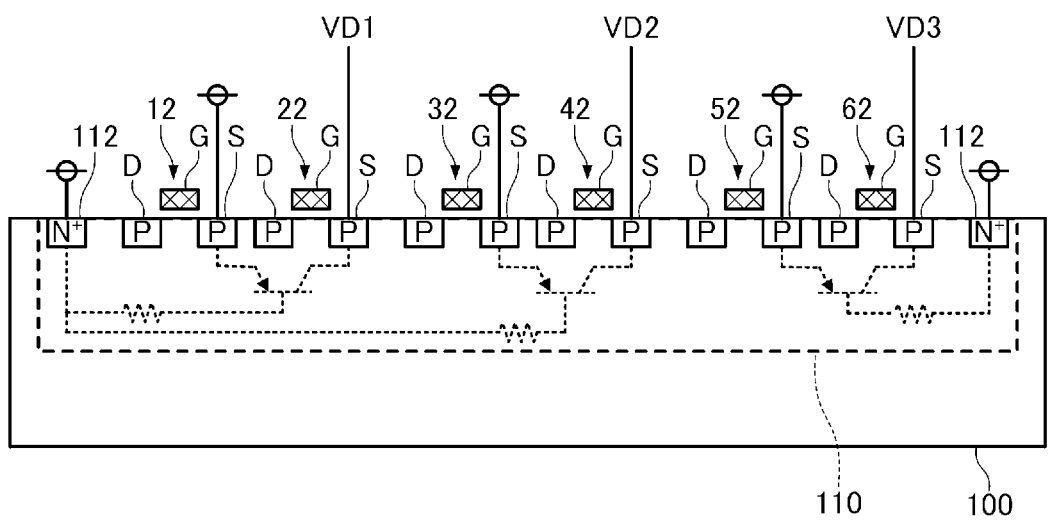
FIG. 11 is a cross-sectional view of an arrangement region of the PMOS transistors of FIG. 9 taken along the line XI-XI.

FIGS. 9, 10, and 11 are diagrams illustrating examples of arrangement of the MOS transistors constituting the selector 6 in the semiconductor integrated circuit 1 of the second embodiment. FIG. 9 is a diagram illustrating the arrangement of the MOS transistors when the semiconductor substrate 100 is viewed in plan. FIG. 10 is a cross-sectional view of the arrangement region of the NMOS transistors illustrated in FIG. 9 taken along the line X-X. FIG. 11 is a cross-sectional view of the arrangement region of the PMOS transistors illustrated in FIG. 9 taken along the line XI-XI. In addition, in FIG. 9, the wiring connecting the MOS transistors is denoted by a line segment, and the contact is denoted by x. Further, wiring is omitted in FIGS. 10 and 11. In FIGS. 9, 10, and 11, the letters G, S, and D are attached to the gate, source, and drain of each MOS transistor. It should be noted that FIGS. 9, 10, and 11 are conceptual diagrams for the following description, and there may be addition or deletion of components.

In the example of arrangement in the second embodiment, as illustrated in FIG. 9, the NMOS transistor 11 and the NMOS transistor 21 are disposed to be adjacent to each other in plan view of the semiconductor substrate 100. Specifically, the source of the NMOS transistor 11 and the source of the NMOS transistor 21 are disposed to be adjacent to each other. Therefore, the source of the NMOS transistor 21 is located between the source of the NMOS transistor 11 and the drain of the NMOS transistor 21 in plan view of the semiconductor substrate 100.

Similarly, the NMOS transistor 31 and the NMOS transistor 41 are disposed to be adjacent to each other in plan view of the semiconductor substrate 100. Specifically, the source of the NMOS transistor 31 and the source of the NMOS transistor 41 are disposed to be adjacent to each other. Therefore, the source of the NMOS transistor 41 is located between the source of the NMOS transistor 31 and the drain of the NMOS transistor 41 in plan view of the semiconductor substrate 100.

Similarly, the NMOS transistor 51 and the NMOS transistor 61 are disposed to be adjacent to each other in plan view of the semiconductor substrate 100. Specifically, the source of the NMOS transistor 51 and the source of the NMOS transistor 61 are disposed to be adjacent to each other. Therefore, the source of the NMOS transistor 61 is located between the source of the NMOS transistor 51 and the drain of the NMOS transistor 61 in plan view of the semiconductor substrate 100.

In the second embodiment, as illustrated in FIG. 10, as in the comparative example described above, parasitic NPN transistors are formed in which the source of the NMOS transistor 11, the P well 120, and the drain of the NMOS transistor 21 serve as an emitter, a base, and a collector, respectively. Similarly, parasitic NPN transistors are formed in which the source of the NMOS transistor 31, the P well 120, and the drain of the NMOS transistor 41 serve as an emitter, a base, and a collector, respectively. Similarly, parasitic NPN transistors are formed in which the source of the NMOS transistor 51, the P well 120, and the drain of the NMOS transistor 61 serve as an emitter, a base, and a collector, respectively. In addition, the sources of the NMOS transistors 11, 31, and 51 are supplied with the power supply voltage VSS, and the drains of the NMOS transistors 21, 41 and 61 are supplied with the power supply voltages VD1, VD2, and VD3 higher than the power supply voltage VSS, respectively. Therefore, in each of the parasitic three NPN transistors, a potential of the collector is higher than a potential of the emitter. Further, although the P+ region 122 is supplied with the power supply voltage VSS, the resistance component of the P well 120 makes the potential of the base of each NPN transistor higher than the power supply voltage VSS. Therefore, in each NPN transistor, a potential of the base is higher than a potential of the emitter. As a result, each NPN transistor can be turned on.

However, in the second embodiment, since the source of the NMOS transistor 21 is located between the source of the NMOS transistor 11 and the drain of the NMOS transistor 21, the distance between the source of the NMOS transistor 11 and the drain of the NMOS transistor 21 is longer than that in the comparative example. Similarly, the distance between the source of the NMOS transistor 31 and the drain of the NMOS transistor 41 and the distance between the source of the NMOS transistor 51 and the drain of the NMOS transistor 61 are longer than those in the comparative example. That is, the distance between the emitter and collector of each NPN transistor increases, and as a result, the base width of each NPN transistor increases. Therefore, the current drive capability of each NPN transistor is lower than that of the ESD protection circuit 7 illustrated in FIG. 1. Therefore, when large external noise such as static electricity having a voltage higher than the power supply voltage VDD is applied to the external terminal T3, a large current flows from the external terminal T3 to the ground through the ESD protection circuit 7. That is, the selector 6 is protected by the ESD protection circuit 7, and the possibility that the MOS transistors each having a low withstand voltage and constituting the selector 6 are broken is reduced.

In the example of arrangement in the second embodiment, as illustrated in FIG. 9, the PMOS transistor 12 and the PMOS transistor 22 are disposed to be adjacent to each other in plan view of the semiconductor substrate 100. Specifically, the source of the PMOS transistor 12 and the drain of the PMOS transistor 22 are disposed to be adjacent to each other. Therefore, the drain of the PMOS transistor 22 is located between the source of the PMOS transistor 12 and the source of the PMOS transistor 22 in plan view of the semiconductor substrate 100.

Similarly, the PMOS transistor 32 and the PMOS transistor 42 are disposed to be adjacent to each other in plan view of the semiconductor substrate 100. Specifically, the source of the PMOS transistor 32 and the drain of the PMOS transistor 42 are disposed to be adjacent to each other. Therefore, the drain of the PMOS transistor 42 is located between the source of the PMOS transistor 32 and the source of the PMOS transistor 42 in plan view of the semiconductor substrate 100.

Similarly, the PMOS transistor 52 and the PMOS transistor 62 are disposed to be adjacent to each other in plan view of the semiconductor substrate 100. Specifically, the source of the PMOS transistor 52 and the drain of the PMOS transistor 62 are disposed to be adjacent to each other. Therefore, the drain of the PMOS transistor 62 is located between the source of the PMOS transistor 52 and the source of the PMOS transistor 62 in plan view of the semiconductor substrate 100.

In the second embodiment, as in the comparative example described above, as illustrated in FIG. 11, parasitic PNP transistors are formed in which the source of the PMOS transistor 12, the N well 110, and the source of the PMOS transistor 22 serve as an emitter, a base, and a collector, respectively. Similarly, parasitic PNP transistors are formed in which the source of the PMOS transistor 32, the N well 110, and the source of the PMOS transistor 42 serve as an emitter, a base, and a collector, respectively. Similarly, parasitic PNP transistors are formed in which the source of the PMOS transistor 52, the N well 110, and the source of the PMOS transistor 62 serve as an emitter, a base, and a collector, respectively. In addition, the sources of the PMOS transistors 12, 32, and 52 are supplied with the power supply voltage VDD, and the sources of the PMOS transistors 22, 42 and 62 are supplied with the power supply voltages VD1, VD2, and VD3 lower than the power supply voltage VDD, respectively. Therefore, in each of the three parasitic PNP transistors, a potential of the emitter is higher than a potential of the collector. Further, although the power supply voltage VDD is supplied to the N+ region 112, the resistance component of the N well 110 makes a potential at the base of each PNP transistor lower than the power supply voltage VDD. Therefore, in each PNP transistor, a potential of the emitter is higher than a potential of the base. As a result, each PNP transistor can be turned on.

However, in the second embodiment, since the drain of the PMOS transistor 22 is located between the source of the PMOS transistor 12 and the source of the PMOS transistor 22, the distance between the source of the PMOS transistor 12 and the source of the PMOS transistor 22 is longer than that in the comparative example. Similarly, the distance between the source of the PMOS transistor 32 and the source of the PMOS transistor 42 and the distance between the source of the PMOS transistor 52 and the source of the PMOS transistor 62 are longer than those in the comparative example. That is, the distance between the collector and the emitter of each PNP transistor increases, and as a result, the base width of each PNP transistor increases. Therefore, the current drive capability of each PNP transistor is lower than that of the ESD protection circuit 7 illustrated in FIG. 1.

Therefore, when large external noise such as static electricity having a voltage lower than the power supply voltage VSS is applied to the external terminal T3, a large current flows from the power supply to the external terminal T3 through the ESD protection circuit 7. That is, the selector 6 is protected by the ESD protection circuit 7, and the possibility that the MOS transistors each having a low withstand voltage and constituting the selector 6 are broken is reduced.

In the semiconductor integrated circuit 1 of the first embodiment or the second embodiment, the NMOS transistor 11 and the NMOS transistor 21 are examples of the "first MOS transistor" and the "second MOS transistor", respectively. Further, the source and the drain of the NMOS transistor 11 are examples of a "first N-type region" and a "second N-type region", respectively, and the source and the drain of the NMOS transistor 21 are examples of a "fourth N-type region" and a "third N-type region", respectively. Further, the power supply voltage VSS supplied to the source of the NMOS transistor 11 is an example of a "first power supply voltage", and the power supply voltage VD1 supplied to the drain of the NMOS transistor 21 is an example of a "second power supply voltage". The PMOS transistor 12 and the PMOS transistor 22 are examples of a "fifth MOS transistor" and a "sixth MOS transistor", respectively.

Alternatively, the NMOS transistor 31 and the NMOS transistor 41 are examples of the "first MOS transistor" and the "second MOS transistor", respectively. Further, the source and the drain of the NMOS transistor 31 are examples of the "first N-type region" and the "second N-type region", respectively, and the source and the drain of the NMOS transistor 41 are examples of the "fourth N-type region" and the "third N-type region", respectively. Further, the power supply voltage VSS supplied to the source of the NMOS transistor 31 is an example of the "first power supply voltage", and the power supply voltage VD2 supplied to the drain of the NMOS transistor 41 is an example of the "second power supply voltage". The PMOS transistor 32 and the PMOS transistor 42 are examples of the "fifth MOS transistor" and the "sixth MOS transistor", respectively.

Alternatively, the NMOS transistor 51 and the NMOS transistor 61 are examples of the "first MOS transistor" and the "second MOS transistor", respectively. Further, the source and the drain of the NMOS transistor 51 are examples of the "first N-type region" and the "second N-type region", respectively, and the source and the drain of the NMOS transistor 61 are examples of the "fourth N-type region" and the "third N-type region", respectively. Further, the power supply voltage VSS supplied to the source of the NMOS transistor 51 is an example of the "first power supply voltage", and the power supply voltage VD3 supplied to the drain of the NMOS transistor 61 is an example of the "second power supply voltage". The PMOS transistor 52 and the PMOS transistor 62 are examples of the "fifth MOS transistor" and the "sixth MOS transistor", respectively.

Alternatively, the PMOS transistor 12 and the PMOS transistor 22 are examples of the "first MOS transistor" and the "second MOS transistor", respectively. Further, the source and the drain of the PMOS transistor 12 are examples of the "first P-type region" and the "second P-type region", respectively, and the source and the drain of the PMOS transistor 22 are examples of the "third P-type region" and the "fourth P-type region", respectively. Further, the power supply voltage VDD supplied to the source of the PMOS transistor 12 is an example of the "first power supply voltage", and the power supply voltage VD1 supplied to the source of the PMOS transistor 22 is an example of the "second power supply voltage". Further, the NMOS transistor 11 and the NMOS transistor 21 are examples of the "fifth MOS transistor" and the "sixth MOS transistor", respectively.

Alternatively, the PMOS transistor 32 and the PMOS transistor 42 are examples of the "first MOS transistor" and the "second MOS transistor", respectively. Further, the source and the drain of the PMOS transistor 32 are examples of the "first P-type region" and the "second P-type region", respectively, and the source and the drain of the PMOS transistor 42 are examples of the "third P-type region" and the "fourth P-type region", respectively. Further, the power supply voltage VDD supplied to the source of the PMOS transistor 32 is an example of the "first power supply voltage", and the power supply voltage VD2 supplied to the source of the PMOS transistor 42 is an example of the "second power supply voltage". Further, the NMOS transistor 31 and the NMOS transistor 41 are examples of the "fifth MOS transistor" and the "sixth MOS transistor", respectively.

Alternatively, the PMOS transistor 52 and the PMOS transistor 62 are examples of the "first MOS transistor" and the "second MOS transistor", respectively. Further, the source and the drain of the PMOS transistor 52 are examples of the "first P-type region" and the "second P-type region", respectively, and the source and the drain of the PMOS transistor 62 are examples of the "third P-type region" and the "fourth P-type region", respectively. Further, the power supply voltage VDD supplied to the source of the PMOS transistor 52 is an example of the "first power supply voltage", and the power supply voltage VD3 supplied to the source of the PMOS transistor 62 is an example of the "second power supply voltage". Further, the NMOS transistor 51 and the NMOS transistor 61 are examples of the "fifth MOS transistor" and the "sixth MOS transistor", respectively.

1-3. Third Embodiment

The semiconductor integrated circuit 1 of the third embodiment is the same as the semiconductor integrated circuit 1 of the first embodiment except for the arrangement of the MOS transistors constituting the selector 6. Hereinafter, in the semiconductor integrated circuit 1 of the third embodiment, the same components as those in the first embodiment are denoted by the same reference numerals, the contents different from the first embodiment will be described, and the redundant contents will be omitted.

Figure 12:
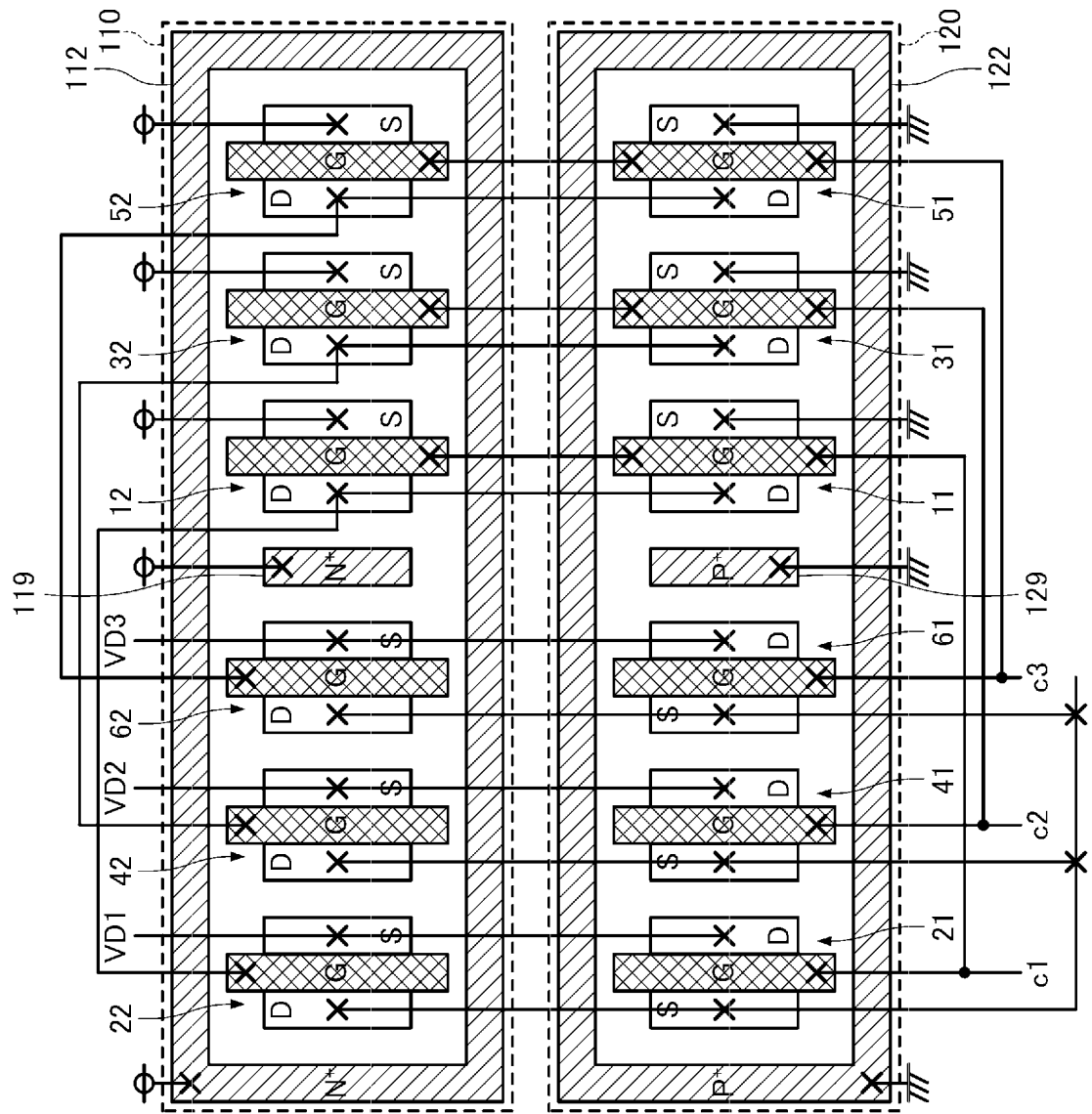
FIG. 12 is a diagram illustrating an example of arrangement of MOS transistors constituting a selector in a third embodiment.

FIG. 12 is a diagram illustrating an example of arrangement of the MOS transistors constituting the selector 6 in the semiconductor integrated circuit 1 of the third embodiment. FIG. 12 is a diagram illustrating the arrangement of the MOS transistors when the semiconductor substrate 100 is viewed in plan. In addition, in FIG. 12, the wiring connecting the MOS transistors is denoted by a line segment, and the contact is denoted by x. Further, in FIG. 12, letters G, S, and D are attached to the gate, source, and drain of each MOS transistor. It should be noted that FIG. 12 is a conceptual diagram for the following description, and there may be addition or deletion of components.

In the example of arrangement in the third embodiment, as illustrated in FIG. 12, the NMOS transistor 11 and the NMOS transistor 31 are disposed to be adjacent to each other in plan view of the semiconductor substrate 100. Specifically, the source of the NMOS transistor 11 and the drain of the NMOS transistor 31 are disposed to be adjacent to each other. Similarly, the NMOS transistor 31 and the NMOS transistor 51 are disposed to be adjacent to each other. Specifically, the source of the NMOS transistor 31 and the drain of the NMOS transistor 51 are disposed to be adjacent to each other. Further, the NMOS transistor 21 and the NMOS transistor 41 are disposed to be adjacent to each other in plan view of the semiconductor substrate 100. Specifically, the drain of the NMOS transistor 21 and the source of the NMOS transistor 41 are disposed to be adjacent to each other. Similarly, the NMOS transistor 41 and the NMOS transistor 61 are disposed to be adjacent to each other. Specifically, the drain of the NMOS transistor 41 and the source of the NMOS transistor 61 are disposed to be adjacent to each other.

The source of the NMOS transistor 11 and the drain of the NMOS transistor 61 are located between the source of the NMOS transistor 31 and the drain of the NMOS transistor 61. As described above, in the example of arrangement in the third embodiment, in the P well 120, the arrangement region of the NMOS transistors 11, 31, and 51 respectively constituting parts of the inverter circuits 10, 30, and 50 is separated from the arrangement region of the NMOS transistors 21, 41, and 61 constituting parts of the analog switch circuits 20, 40, and 60. In addition, the NMOS transistor 11 and the NMOS transistor 61 are disposed to be adjacent to each other in plan view of the semiconductor substrate 100. Specifically, the drain of the NMOS transistor 11 and the drain of the NMOS transistor 61 are disposed to be adjacent to each other.

In the example of arrangement in the third embodiment, the P+ region 129 supplied with the power supply voltage VSS is provided inside the P+ region 122 in the P well 120. The P+ region 129 is a P-type region of which the impurity concentration is higher than that of the surroundings. In addition, the P+ region 129 is located between the source of the NMOS transistor 11 and the drain of the NMOS transistor 61. Therefore, parasitic NPN transistors are formed in which the source of the NMOS transistor 11, the P+ region 129, and the drain of the NMOS transistor 61 serve as an emitter, a base, and a collector, respectively.

The source of the NMOS transistor 11 is supplied with the power supply voltage VSS, and the drain of the NMOS transistor 61 is supplied with the power supply voltage VD3 higher than the power supply voltage VSS. Therefore, in the parasitic NPN transistor, the potential of the collector is higher than the potential of the emitter. However, since the P+ region 129 is supplied with the power supply voltage VSS, the potential difference between the base and the emitter of the NPN transistor becomes zero. Therefore, the NPN transistor is turned off, and no current flows from the collector to the emitter. Therefore, when large external noise such as static electricity having a voltage higher than the power supply voltage VDD is applied to the external terminal T3, a large current flows from the external terminal T3 to the ground through the ESD protection circuit 7. That is, the selector 6 is protected by the ESD protection circuit 7, and the possibility that the MOS transistors each having a low withstand voltage and constituting the selector 6 are broken is reduced.

In the example of arrangement in the third embodiment, as illustrated in FIG. 12, the PMOS transistor 12 and the PMOS transistor 32 are disposed to be adjacent to each other in plan view of the semiconductor substrate 100. Specifically, the source of the PMOS transistor 12 and the drain of the PMOS transistor 32 are disposed to be adjacent to each other. Similarly, the PMOS transistor 32 and the PMOS transistor 52 are disposed to be adjacent to each other. Specifically, the source of the PMOS transistor 32 and the drain of the PMOS transistor 52 are disposed to be adjacent to each other. Further, the PMOS transistor 22 and the PMOS transistor 42 are disposed to be adjacent to each other in plan view of the semiconductor substrate 100. Specifically, the source of the PMOS transistor 22 and the drain of the PMOS transistor 42 are disposed to be adjacent to each other. Similarly, the PMOS transistor 42 and the PMOS transistor 62 are disposed to be adjacent to each other. Specifically, the source of the PMOS transistor 42 and the drain of the PMOS transistor 62 are disposed to be adjacent to each other.

The source of the PMOS transistor 12 and the source of the PMOS transistor 62 are located between the source of the PMOS transistor 32 and the source of the PMOS transistor 62. As described above, in the example of arrangement in the third embodiment, in the N well 110, the arrangement region of the PMOS transistors 12, 32, and 52 respectively constituting parts of the inverter circuits 10, 30, and 50 is separated from the arrangement region of the PMOS transistors 22, 42, and 62 respectively constituting parts of the analog switch circuits 20, 40, and 60. In addition, the PMOS transistor 12 and the PMOS transistor 62 are disposed to be adjacent to each other in plan view of the semiconductor substrate 100. Specifically, the drain of the PMOS transistor 12 and the source of the PMOS transistor 62 are disposed to be adjacent to each other.

In the example of arrangement in the third embodiment, the N+ region 119 supplied with the power supply voltage VDD is provided inside the N+ region 112 in the N well 110. The N+ region 119 is an N-type region of which the impurity concentration is higher than that of the surroundings. The N+ region 119 is located between the source of the PMOS transistor 12 and the source of the PMOS transistor 62. Therefore, parasitic PNP transistors are formed in which the source of the PMOS transistor 12, the N+ region 119, and the source of the PMOS transistor 62 serve as an emitter, a base, and a collector, respectively.

The source of the PMOS transistor 12 is supplied with the power supply voltage VDD, and the source of the PMOS transistor 62 is supplied with the power supply voltage VD3 lower than the power supply voltage VDD. Therefore, in the parasitic PNP transistor, the potential of the emitter is higher than the potential of the collector. However, since the N+ region 119 is supplied with the power supply voltage VDD, the potential difference between the emitter and the base of the PNP transistor becomes zero. Therefore, the PNP transistor is turned off, and no current flows from the emitter to the collector. Therefore, when large external noise such as static electricity having a voltage lower than the power supply voltage VSS is applied to the external terminal T3, a large current flows from the power supply to the external terminal T3 through the ESD protection circuit 7. That is, the selector 6 is protected by the ESD protection circuit 7, and the possibility that the MOS transistors each having a low withstand voltage and constituting the selector 6 are broken is reduced.

1-4. Fourth Embodiment

The semiconductor integrated circuit 1 of the fourth embodiment is the same as the semiconductor integrated circuit 1 of the second embodiment except for the arrangement of the MOS transistors constituting the selector 6. Hereinafter, in the semiconductor integrated circuit 1 of the fourth embodiment, the same components as those in the second embodiment are denoted by the same reference numerals, the contents different from the second embodiment will be described, and the redundant contents will be omitted.

Figure 13:
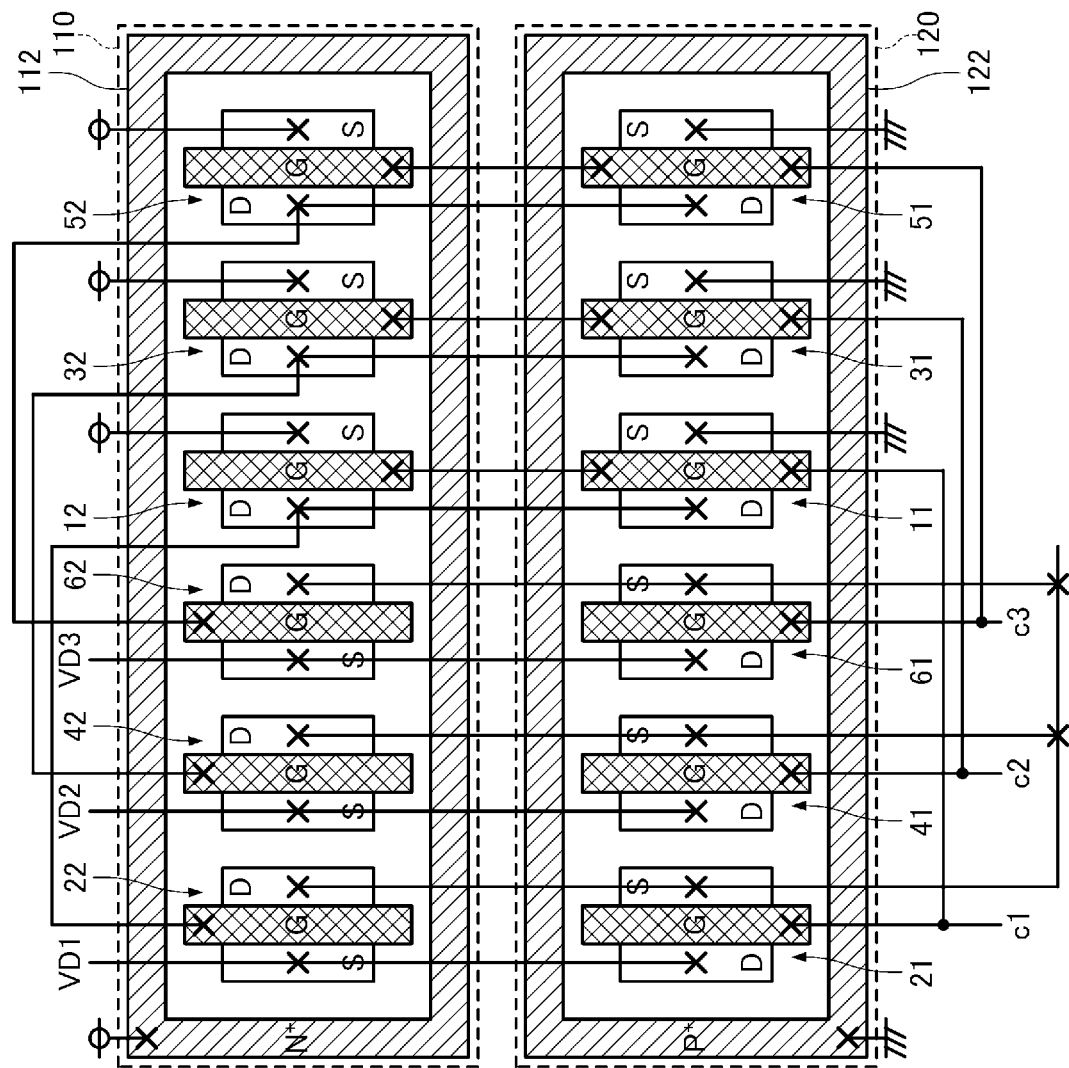
FIG. 13 is a diagram illustrating an example of arrangement of MOS transistors constituting a selector in a fourth embodiment.

FIG. 13 is a diagram illustrating an example of arrangement of the MOS transistors constituting the selector 6 in the semiconductor integrated circuit 1 of the fourth embodiment. FIG. 13 is a diagram illustrating the arrangement of the MOS transistors when the semiconductor substrate 100 is viewed in plan. In addition, in FIG. 13, the wiring connecting the MOS transistors is denoted by a line segment, and the contact is denoted by x. Further, in FIG. 13, letters G, S, and D are attached to the gate, source, and drain of each MOS transistor. It should be noted that FIG. 13 is a conceptual diagram for the following description, and there may be addition or deletion of components.

In the example of arrangement in the fourth embodiment, as illustrated in FIG. 13, the NMOS transistor 11 and the NMOS transistor 31 are disposed to be adjacent to each other in plan view of the semiconductor substrate 100. Specifically, the source of the NMOS transistor 11 and the drain of the NMOS transistor 31 are disposed to be adjacent to each other. Similarly, the NMOS transistor 31 and the NMOS transistor 51 are disposed to be adjacent to each other. Specifically, the source of the NMOS transistor 31 and the drain of the NMOS transistor 51 are disposed to be adjacent to each other. Further, the NMOS transistor 21 and the NMOS transistor 41 are disposed to be adjacent to each other in plan view of the semiconductor substrate 100. Specifically, the source of the NMOS transistor 21 and the drain of the NMOS transistor 41 are disposed to be adjacent to each other. Similarly, the NMOS transistor 41 and the NMOS transistor 61 are disposed to be adjacent to each other. Specifically, the source of the NMOS transistor 41 and the drain of the NMOS transistor 61 are disposed to be adjacent to each other.

The source of the NMOS transistor 11 and the drain of the NMOS transistor 61 are located between the source of the NMOS transistor 31 and the drain of the NMOS transistor 61. As described above, in the example of arrangement in the fourth embodiment, in the P well 120, the arrangement region of the NMOS transistors 11, 31, and 51 respectively constituting parts of the inverter circuits 10, 30, and 50 is separated from the arrangement region of the NMOS transistors 21, 41, and 61 respectively constituting parts of the analog switch circuits 20, 40, and 60. In addition, the NMOS transistor 11 and the NMOS transistor 61 are disposed to be adjacent to each other in plan view of the semiconductor substrate 100. Specifically, the drain of the NMOS transistor 11 and the source of the NMOS transistor 61 are disposed to be adjacent to each other. Therefore, the drain of the NMOS transistor 11 and the source of the NMOS transistor 61 are located between the source of the NMOS transistor 11 and the drain of the NMOS transistor 61 in plan view of the semiconductor substrate 100.

In the fourth embodiment, parasitic NPN transistors are formed in which the source of the NMOS transistor 11, the P well 120, and the drain of the NMOS transistor 61 serve as an emitter, abase, and a collector, respectively. In addition, the source of the NMOS transistor 11 is supplied with the power supply voltage VSS, and the drain of the NMOS transistor 61 is supplied with the power supply voltage VD3 higher than the power supply voltage VSS. Therefore, in the parasitic NPN transistor, the potential of the collector is higher than the potential of the emitter. Further, although the P+ region 122 is supplied with the power supply voltage VSS, the resistance component of the P well 120 makes the potential of the base of the NPN transistor higher than the power supply voltage VSS. Therefore, in the NPN transistor, a potential of the base is higher than a potential of the emitter. As a result, the NPN transistor can be turned on.

However, in the fourth embodiment, since the drain of the NMOS transistor 11 and the source of the NMOS transistor 61 are located between the source of the NMOS transistor 11 and the drain of the NMOS transistor 61, the distance between the source of the NMOS transistor 11 and the drain of the NMOS transistor 61 increases. That is, the distance between the emitter and the collector of the NPN transistor increases, and as a result, the base width of the NPN transistor increases. Therefore, the current drive capability of the NPN transistor is lower than that of the ESD protection circuit 7 illustrated in FIG. 1. Therefore, when large external noise such as static electricity having a voltage higher than the power supply voltage VDD is applied to the external terminal T3, a large current flows from the external terminal T3 to the ground through the ESD protection circuit 7. That is, the selector 6 is protected by the ESD protection circuit 7, and the possibility that the MOS transistors each having a low withstand voltage and constituting the selector 6 are broken is reduced.

In the example of arrangement in the fourth embodiment, as illustrated in FIG. 13, the PMOS transistor 12 and the PMOS transistor 32 are disposed to be adjacent to each other in plan view of the semiconductor substrate 100. Specifically, the source of the PMOS transistor 12 and the drain of the PMOS transistor 32 are disposed to be adjacent to each other. Similarly, the PMOS transistor 32 and the PMOS transistor 52 are disposed to be adjacent to each other. Specifically, the source of the PMOS transistor 32 and the drain of the PMOS transistor 52 are disposed to be adjacent to each other. Further, the PMOS transistor 22 and the PMOS transistor 42 are disposed to be adjacent to each other in plan view of the semiconductor substrate 100. Specifically, the drain of the PMOS transistor 22 and the source of the PMOS transistor 42 are disposed to be adjacent to each other. Similarly, the PMOS transistor 42 and the PMOS transistor 62 are disposed to be adjacent to each other. Specifically, the drain of the PMOS transistor 42 and the source of the PMOS transistor 62 are disposed to be adjacent to each other.

The source of the PMOS transistor 12 and the source of the PMOS transistor 62 are located between the source of the PMOS transistor 32 and the source of the PMOS transistor 62. As described above, in the example of arrangement in the third embodiment, in the N well 110, the arrangement region of the PMOS transistors 12, 32, and 52 respectively constituting parts of the inverter circuits 10, 30, and 50 is separated from the arrangement region of the PMOS transistors 22, 42, and 62 respectively constituting parts of the analog switch circuits 20, 40, and 60. In addition, the PMOS transistor 12 and the PMOS transistor 62 are disposed to be adjacent to each other in plan view of the semiconductor substrate 100. Specifically, the drain of the PMOS transistor 12 and the drain of the PMOS transistor 62 are disposed to be adjacent to each other. Therefore, the drain of the PMOS transistor 12 and the drain of the PMOS transistor 62 are located between the source of the PMOS transistor 12 and the source of the PMOS transistor 62 in plan view of the semiconductor substrate 100.

In the fourth embodiment, parasitic PNP transistors are formed in which the source of the PMOS transistor 12, the N well 110, and the source of the PMOS transistor 62 serve as an emitter, a base, and a collector, respectively. In addition, the source of the PMOS transistor 12 is supplied with the power supply voltage VDD, and the source of the PMOS transistor 62 is supplied with the power supply voltage VD3 lower than the power supply voltage VDD. Therefore, in the parasitic PNP transistor, the potential of the emitter is higher than the potential of the collector. Further, although the power supply voltage VDD is supplied to the N+ region 112, the resistance component of the N well 110 makes the potential of the base of the PNP transistor lower than the power supply voltage VDD. Therefore, in the PNP transistor, the potential of the emitter is higher than the potential of the base. As a result, the PNP transistor can be turned on.

However, in the fourth embodiment, since the drain of the PMOS transistor 12 and the drain of the PMOS transistor 62 are located between the source of the PMOS transistor 12 and the source of the PMOS transistor 62, the distance between the source of the PMOS transistor 12 and the source of the PMOS transistor 62 is longer than that in the comparative example. That is, the distance between the collector and the emitter of the PNP transistor increases, and as a result, the base width of the PNP transistor increases. Therefore, the current drive capability of the PNP transistor is lower than that of the ESD protection circuit 7 illustrated in FIG. 1. Therefore, when large external noise such as static electricity having a voltage lower than the power supply voltage VSS is applied to the external terminal T3, a large current flows from the power supply to the external terminal T3 through the ESD protection circuit 7. That is, the selector 6 is protected by the ESD protection circuit 7, and the possibility that the MOS transistors each having a low withstand voltage and constituting the selector 6 are broken is reduced.

In the semiconductor integrated circuit 1 of the third embodiment or the fourth embodiment, the NMOS transistor 11 and the NMOS transistor 61 are examples of the "first MOS transistor" and the "second MOS transistor", respectively. Further, the source and the drain of the NMOS transistor 11 are examples of the "first N-type region" and the "second N-type region", respectively, and the source and the drain of the NMOS transistor 61 are examples of the "fourth N-type region" and the "third N-type region", respectively. Further, the NMOS transistor 31 and the NMOS transistor 41 are examples of the "third MOS transistor" and the "fourth MOS transistor", respectively. Further, the source and drain of the NMOS transistor 31 are examples of the "fifth N-type region" and the "sixth N-type region", respectively, and the source and drain of the NMOS transistor 41 are examples of the "eighth N-type regions" and the "seventh N-type region", respectively. Further, the power supply voltage VSS supplied to each source of the NMOS transistors 11 and 31 is an example of the "first power supply voltage", the power supply voltage VD3 supplied to the drain of the NMOS transistor 61 is an example of the "second power supply voltage", and the power supply voltage VD2 supplied to the drain of the NMOS transistor 41 is an example of the "third power supply voltage". The PMOS transistor 12 and the PMOS transistor 62 are examples of the "fifth MOS transistor" and the "sixth MOS transistor", respectively.

Alternatively, the PMOS transistor 12 and the PMOS transistor 62 are examples of the "first MOS transistor" and the "second MOS transistor", respectively. Further, the source and the drain of the PMOS transistor 12 are examples of the "first P-type region" and the "second P-type region", respectively, and the source and the drain of the PMOS transistor 62 are examples of the "third P-type region" and the "fourth P-type region", respectively. The PMOS transistor 32 and the PMOS transistor 42 are examples of the "third MOS transistor" and the "fourth MOS transistor", respectively. Further, the source and drain of the PMOS transistor 32 are examples of the "fifth P-type region" and the "sixth P-type region", respectively, and the source and drain of the PMOS transistor 42 are examples of the "the seventh P-type region" and the "eighth P-type region", respectively. Further, the power supply voltage VDD supplied to each source of the PMOS transistors 12 and 32 is an example of the "first power supply voltage", the power supply voltage VD3 supplied to the source of the PMOS transistor 62 is an example of the "second power supply voltage", and the power supply voltage VD2 supplied to the source of the PMOS transistor 42 is an example of the "third power supply voltage". Further, the NMOS transistor 11 and the NMOS transistor 61 are examples of the "fifth MOS transistor" and the "sixth MOS transistor", respectively.

1-5. Modification Example

First Modification Example

Figure 14:
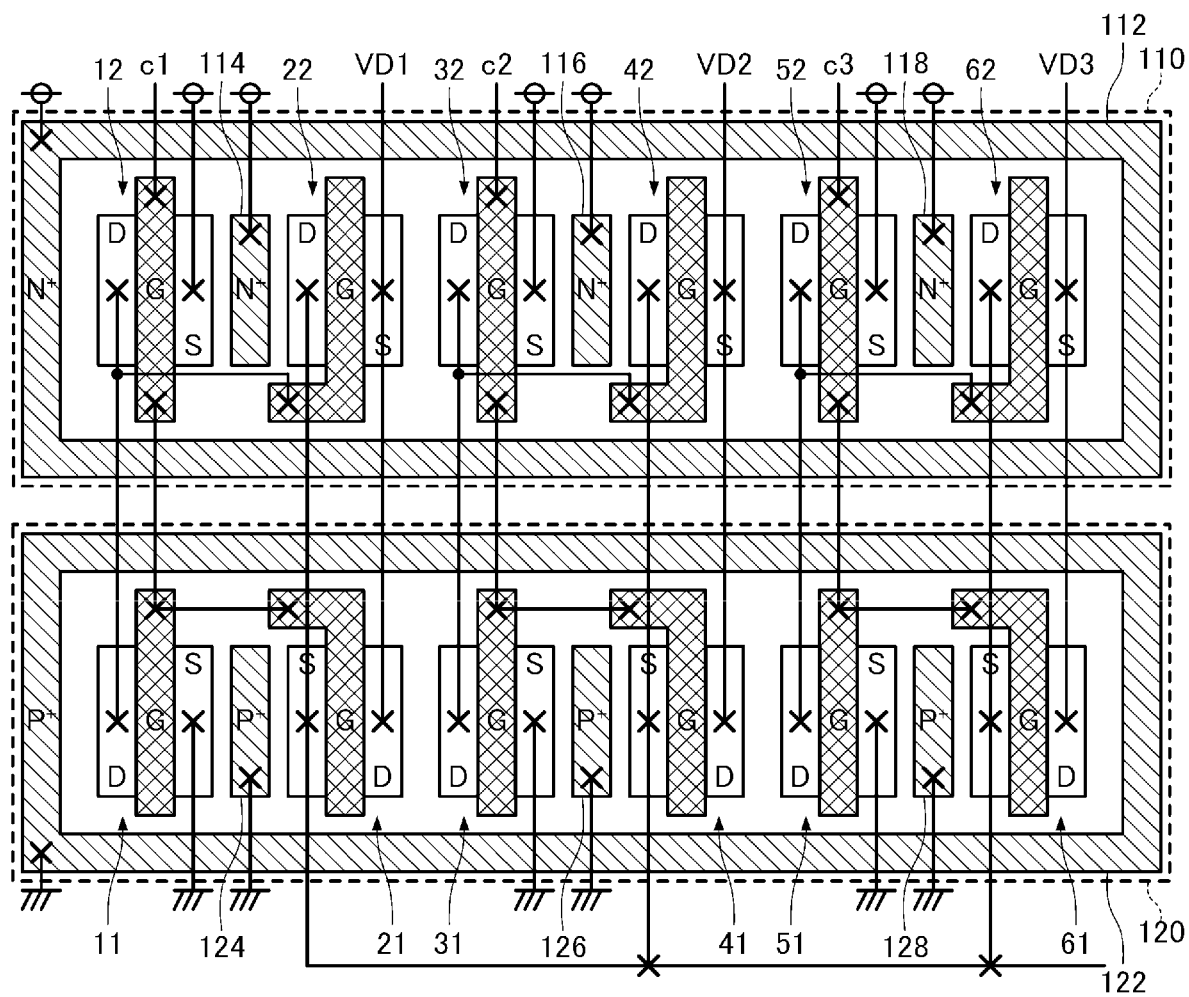
FIG. 14 is a diagram illustrating an example of arrangement of MOS transistors constituting a selector in a first modification example.

FIG. 14 is a diagram illustrating an example of arrangement of the MOS transistors constituting the selector 6 in the semiconductor integrated circuit 1 of the first modification example. FIG. 14 is a diagram illustrating the arrangement of the MOS transistors when the semiconductor substrate 100 is viewed in plan. In addition, in FIG. 14, the wiring connecting the MOS transistors is denoted by a line segment, and the contact is denoted by x. Further, in FIG. 14, letters G, S, and D are attached to the gate, source, and drain of each MOS transistor. It should be noted that FIG. 14 is a conceptual diagram for the following description, and there may be addition or deletion of components.

In the example of arrangement in the first modification example, as in the example of arrangement in semiconductor integrated circuit 1 of the first embodiment illustrated in FIG. 6, three P+ regions 124, 126, and 128 supplied with the power supply voltages VSS are provided inside the P+ region 122 in P well 120. The P+ region 124 is located between the source of the NMOS transistor 11 and the drain of the NMOS transistor 21 in plan view of the semiconductor substrate 100. Similarly, the P+ region 126 is located between the source of the NMOS transistor 31 and the drain of the NMOS transistor 41. Similarly, the P+ region 128 is located between the source of NMOS transistor 51 and the drain of NMOS transistor 61. Further, three N+ regions 114, 116, and 118 supplied with the power supply voltage VDD are provided inside N+ region 112 in the N well 110. The N+ region 114 is located between the source of the PMOS transistor 12 and the source of the PMOS transistor 22 in plan view of the semiconductor substrate 100. Similarly, the N+ region 116 is located between the source of PMOS transistor 32 and the source of PMOS transistor 42. Similarly, the N+ region 118 is located between the source of PMOS transistor 52 and the source of PMOS transistor 62.

In the example of arrangement of the first modification example, as in the example of arrangement of the semiconductor integrated circuit 1 of the second embodiment illustrated in FIG. 9, in plan view of the semiconductor substrate 100, the source of the NMOS transistor 11 and the source of the NMOS transistor 21 are disposed to be adjacent to each other, and the source of the NMOS transistor 21 is located between the source of the NMOS transistor 11 and the drain of the NMOS transistor 21. Similarly, the source of the NMOS transistor 31 and the source of the NMOS transistor 41 are disposed to be adjacent to each other, and the source of the NMOS transistor 41 is located between the source of the NMOS transistor 31 and the drain of the NMOS transistor 41. Similarly, the source of the NMOS transistor 51 and the source of the NMOS transistor 61 are disposed to be adjacent to each other, and the source of the NMOS transistor 61 is located between the source of the NMOS transistor 51 and the drain of the NMOS transistor 61. Further, the source of the PMOS transistor 12 and the drain of the PMOS transistor 22 are disposed to be adjacent to each other, and the drain of the PMOS transistor 22 is located between the source of the PMOS transistor 12 and the source of the PMOS transistor 22. Similarly, the source of the PMOS transistor 32 and the drain of the PMOS transistor 42 are disposed to be adjacent to each other, and the drain of the PMOS transistor 42 is located between the source of the PMOS transistor 32 and the source of the PMOS transistor 42. Similarly, the source of the PMOS transistor 52 and the drain of the PMOS transistor 62 are disposed to be adjacent to each other, and the drain of the PMOS transistor 62 is located between the source of the PMOS transistor 52 and the source of the PMOS transistor 62.

Therefore, according to the semiconductor integrated circuit 1 of the first modification example, as compared with the first embodiment and the second embodiment, it is more difficult for current to flow in the parasitic NPN transistor and PNP transistor. Therefore, the possibility that the MOS transistors each having a low withstand voltage and constituting the selector 6 are broken is reduced.

Second Modification Example

Figure 15:
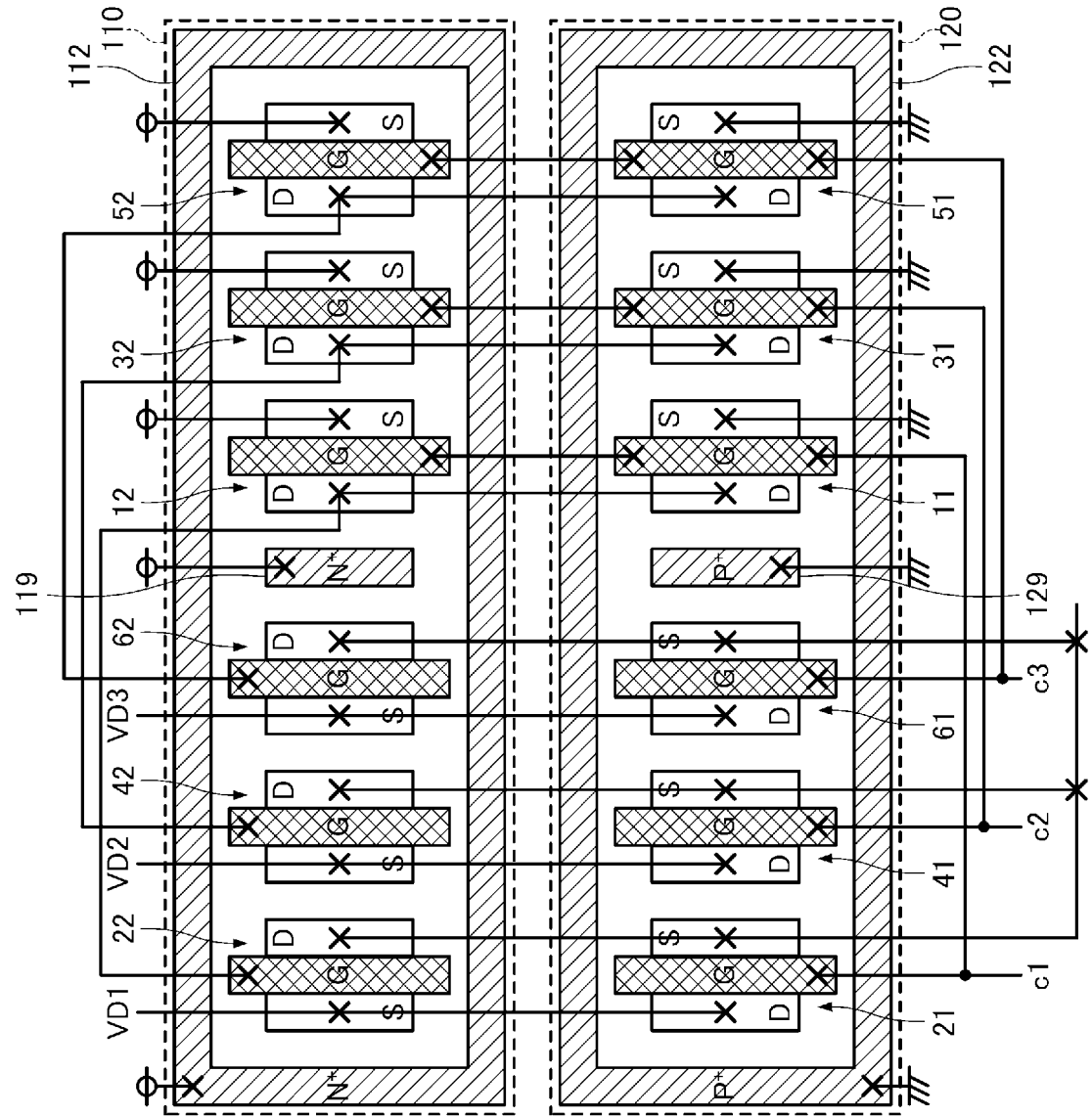
FIG. 15 is a diagram illustrating an example of arrangement of MOS transistors constituting a selector in a second modification example.

FIG. 15 is a diagram illustrating an example of arrangement of the MOS transistors constituting the selector 6 in the semiconductor integrated circuit 1 of the second modification example. FIG. 15 is a diagram illustrating the arrangement of the MOS transistors when the semiconductor substrate 100 is viewed in plan. In addition, in FIG. 15, the wiring connecting the MOS transistors is denoted by a line segment, and the contact is denoted by x. Further, in FIG. 15, letters G, S, and D are attached to the gate, source, and drain of each MOS transistor. It should be noted that FIG. 15 is a conceptual diagram for the following description, and there may be addition or deletion of components.

In the example of arrangement of the second modification example, as in the example of arrangement of the semiconductor integrated circuit 1 of the third embodiment illustrated in FIG. 12, in the P well 120, the arrangement region of the NMOS transistors 11, 31, and 51 respectively constituting parts of the inverter circuits 10, 30, and 50 is separated from the arrangement region of the NMOS transistors 21, 41, and 61 respectively constituting parts of the analog switch circuits 20, 40, and 60. In addition, in the P well 120, the P+ region 129 supplied with the power supply voltage VSS is provided inside the P+ region 122, and the P+ region 129 is located between the source of the NMOS transistor 11 and the drain of the NMOS transistor 61 in plan view of the semiconductor substrate 100. Further, in the N well 110, the arrangement region of the PMOS transistors 12, 32, and 52 respectively constituting parts of the inverter circuits 10, 30, and 50 is separated from the arrangement region of the PMOS transistors 22, 42, and 62 respectively constituting parts of the analog switch circuits 20, 40, and 60. In addition, in the N well 110, the N+ region 119 supplied with the power supply voltage VDD is provided inside the N+ region 112, and the N+ region 119 is located between the source of the PMOS transistor 12 and the source of the PMOS transistor 62 in plan view of the semiconductor substrate 100.

In the example of arrangement of the second modification example, as in the example of arrangement of the semiconductor integrated circuit 1 of the fourth embodiment illustrated in FIG. 13, in plan view of the semiconductor substrate 100, the drain of the NMOS transistor 11 and the source of the NMOS transistor 61 are disposed to be adjacent to each other, and the drain of the NMOS transistor 11 and the source of the NMOS transistor 61 are located between the source of the NMOS transistor 11 and the drain of the NMOS transistor 61. Further, in plan view of the semiconductor substrate 100, the drain of the PMOS transistor 12 and the drain of the PMOS transistor 62 are disposed to be adjacent to each other, and the drain of the PMOS transistor 12 and the drain of the PMOS transistor 62 are located between the source of the PMOS transistor 12 and the source of the PMOS transistor 62.

Therefore, according to the semiconductor integrated circuit 1 of the second modification example, as compared with the third embodiment and the fourth embodiment, it is more difficult for current to flow in the parasitic NPN transistor and PNP transistor. Therefore, the possibility that the MOS transistors each having a low withstand voltage and constituting the selector 6 are broken is reduced.

Third Modification Example

In the semiconductor integrated circuit 1 of the first embodiment, the third embodiment, or the first modification example, the first PMOS transistor, of which the source is supplied with the first power supply voltage, and the second PMOS transistor, of which the source is supplied with the second power supply voltage lower than the first power supply voltage, are disposed to be adjacent to each other. Further, the N+ region supplied with the first power supply voltage is provided, and the N+ region is located between the source of the first PMOS transistor and the source of the second PMOS transistor. In addition, the parasitic PNP transistors are formed in which the source of the first PMOS transistor, the N+ region, and the source of the second PMOS transistor serve as an emitter, a base, and a collector, respectively.

On the other hand, in the semiconductor integrated circuit 1 of the third modification example, the first PMOS transistor, of which the source is supplied with the first power supply voltage, and the second PMOS transistor, of which the drain is supplied with the second power supply voltage lower than the first power supply voltage, are disposed to be adjacent to each other. Further, the N+ region supplied with the first power supply voltage is provided, and the N+ region is located between the source of the first PMOS transistor and the drain of the second PMOS transistor. In addition, the parasitic PNP transistors are formed in which the source of the first PMOS transistor, the N+ region, and the drain of the second PMOS transistor serve as an emitter, a base, and a collector, respectively.

In the semiconductor integrated circuit 1 of the third modification example, as in the semiconductor integrated circuit 1 of the first embodiment, the third embodiment or the second modification example, the potential difference between the emitter and the base of the parasitic PNP transistor becomes zero. Therefore, the PNP transistor is turned off, and no current flows from the emitter to the collector. Consequently, even when external noise is applied to the external terminal T3, the selector 6 is protected by the ESD protection circuit 7, and the possibility that the MOS transistors each having a low withstand voltage and constituting the selector 6 are broken is reduced.

Fourth Modification Example

In the semiconductor integrated circuit 1 according to the second embodiment, the fourth embodiment, or the second modification example, the first PMOS transistor, of which the source is supplied with the first power supply voltage, and the second PMOS transistor, of which the source is supplied with the second power supply voltage lower than the first power supply voltage, are disposed to be adjacent to each other. The drain of the second PMOS transistor is located between the source of the first PMOS transistor and the source of the second PMOS transistor. In addition, the parasitic PNP transistors are formed in which the source of the first PMOS transistor, the N well, and the source of the second PMOS transistor serve as an emitter, a base, and a collector, respectively.

On the other hand, in the semiconductor integrated circuit 1 of the fourth modification example, the first PMOS transistor, of which the source is supplied with the first power supply voltage, and the second PMOS transistor, of which the drain is supplied with the second power supply voltage lower than the first power supply voltage, are disposed to be adjacent to each other. The source of the second PMOS transistor is located between the source of the first PMOS transistor and the drain of the second PMOS transistor. In addition, the parasitic PNP transistors are formed in which the source of the first PMOS transistor, the N well, and the source of the second PMOS transistor serve as an emitter, a base, and a collector, respectively.

In the semiconductor integrated circuit 1 of the fourth modification example, as in the semiconductor integrated circuit 1 of the second embodiment, the fourth embodiment, or the second modification example, the base width of the parasitic PNP transistor increases. Therefore, the current drive capability of the PNP transistor is reduced. Consequently, even when external noise is applied to the external terminal T3, the selector 6 is protected by the ESD protection circuit 7, and the possibility that the MOS transistors each having a low withstand voltage and constituting the selector 6 are broken is reduced.

2. Electronic Device

Figure 16:
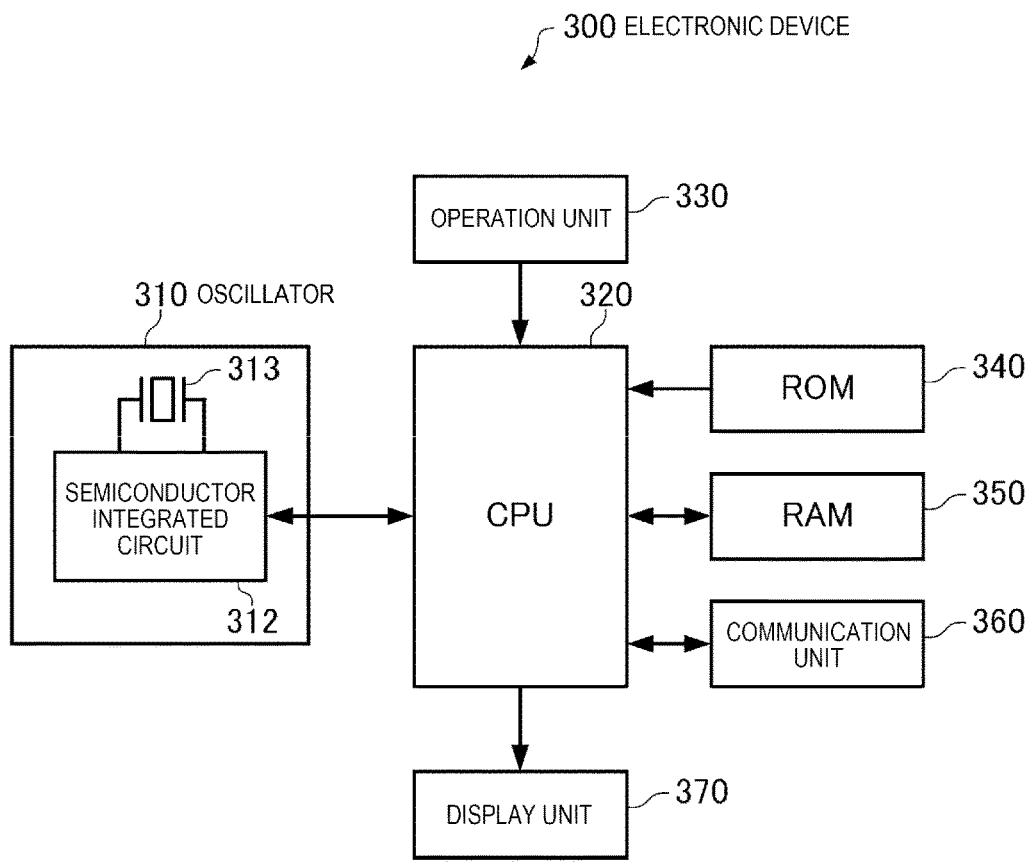
FIG. 16 is a functional block diagram of an electronic device of the present embodiment.
Figure 17:
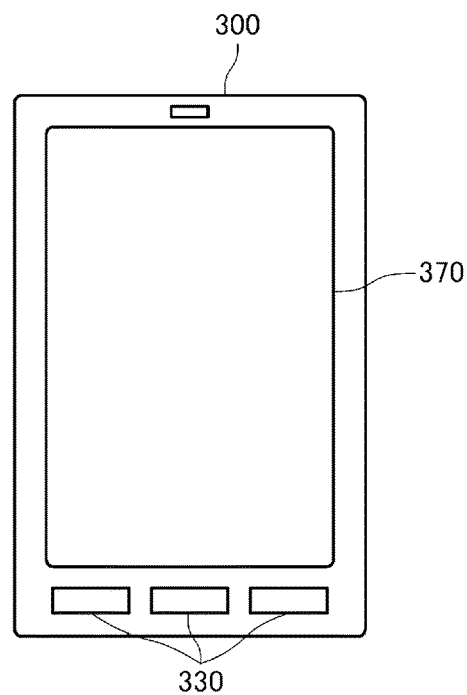
FIG. 17 is a diagram illustrating an example of appearance of the electronic device of the present embodiment.

FIG. 16 is a functional block diagram illustrating an example of a configuration of an electronic device of the present embodiment. Further, FIG. 17 is a diagram illustrating an example of appearance of a smart phone which is an example of the electronic device of the present embodiment.

The electronic device 300 according to the present embodiment is configured to include an oscillator 310, a central processing unit (CPU) 320, an operation unit 330, a read only memory (ROM) 340, a random access memory (RAM) 350, a communication unit 360, and a display unit 370. It should be noted that the electronic device of the present embodiment may have a configuration in which some of the components illustrated in FIG. 16 are omitted or changed or to which other components are added.

The oscillator 310 includes a semiconductor integrated circuit 312 and a resonator 313. The semiconductor integrated circuit 312 oscillates the resonator 313 to generate an oscillation signal. This oscillation signal is output to the CPU 320 from the external terminal of the oscillator 310.

The CPU 320 is a processing unit that performs various calculation processes and control processes using an oscillation signal, which is input from the oscillator 310, as a clock signal in accordance with a program stored in the ROM 340 or the like. Specifically, the CPU 320 performs various processes in response to the operation signal from the operation unit 330, a process of controlling the communication unit 360 to perform data communication with the external device, a process of transmitting a display signal for causing the display unit 370 to display various kinds of information, and the like.

The operation unit 330 is an input device constituted by operation buttons, button switches, and the like, and outputs an operation signal according to an operation performed by the user to the CPU 320.

The ROM 340 is a storage unit that stores programs, data, and the like for causing the CPU 320 to perform various calculation processes and control processes.

The RAM 350 is used as a work region of the CPU 320, and is a storage unit that temporarily stores programs and data read from the ROM 340, data input from the operation unit 330, calculation results executed by the CPU 320 in accordance with various programs, and the like.

The communication unit 360 performs various controls for establishing data communication between the CPU 320 and the external device.

The display unit 370 is a display device constituted by an LCD (Liquid Crystal Display) or the like, and displays various types of information based on a display signal input from the CPU 320. The display unit 370 may be provided with a touch panel functioning as the operation unit 330.

For example, the semiconductor integrated circuit 1 of each of the above-mentioned embodiments may be applied as the semiconductor integrated circuit 312. Thereby, it is possible to reduce the possibility that the MOS transistor is broken by the external noise. As a result, an electronic device with high reliability can be realized.

As such an electronic device 300, various electronic devices can be considered. Examples of the electronic devices include: personal computers such as mobile type, laptop-type and tablet type; mobile terminals such as smart phones and mobile phones; digital cameras; inkjet discharge devices such as inkjet printers; storage area network devices such as routers and switches; local area network devices; devices for mobile terminal base stations; televisions; video cameras; video recorders; car navigation devices; real-time clock devices; pagers; electronic organizers; electronic dictionaries; calculators; electronic game devices; game controllers; word processors; workstations; video phones; television monitors for crime prevention; electronic binoculars; POS terminals; medical devices such as electronic thermometers, blood pressure monitors, blood glucose meters, electrocardiographic measurement devices, ultrasonic diagnostic devices, and electronic endoscopes; fish finders; various measurement devices; instruments of vehicles, aircrafts, ships, and the like; flight simulators; head mounted displays; motion trace devices; motion tracking devices; motion controllers; a pedestrian dead reckoning (PDR) devices; and the like.

As an example of the electronic device 300 of the present embodiment, there is a transmission device functioning as a terminal base station device or the like that performs, for example, wired or wireless communication with a terminal by using the above-mentioned oscillator 310 as a reference signal source. For example, the semiconductor integrated circuit 1 according to each of the above-mentioned embodiments may be applied as the semiconductor integrated circuit 312. For example, it is also possible to realize an electronic device 300 that is capable of being used for a communication base station or the like and that has high frequency accuracy, high performance, and high reliability.

As another example of the electronic device 300 of the present embodiment, there may be a communication device that includes a frequency control unit in which the communication unit 360 receives the external clock signal and the CPU 320 controls a frequency of the oscillator 310 based on the external clock signal and the output signal of the oscillator 310. This communication device may be, for example, a communication device used for a backbone network device such as Stratum 3 or a femtocell.

3. Vehicle

Figure 18:
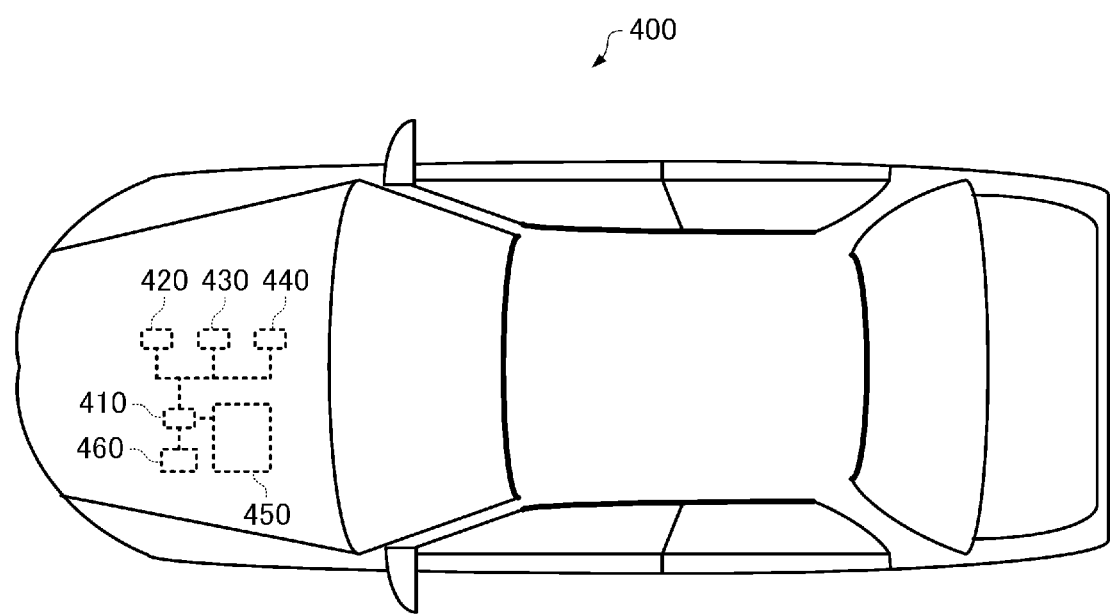
FIG. 18 is a diagram illustrating an example of a vehicle according to the present embodiment.

FIG. 18 is a diagram illustrating an example of the vehicle of the present embodiment. The vehicle 400 illustrated in FIG. 18 is configured to include: an oscillator 410; controllers 420, 430, and 440 that perform various controls for an engine system, a brake system, a keyless entry system, and the like; a battery 450; and a backup battery 460. It should be noted that the vehicle of the present embodiment may have a configuration in which some of the components illustrated in FIG. 18 are omitted or to which other components are added.

The oscillator 410 includes a semiconductor integrated circuit not shown in the drawing and a resonator, and the semiconductor integrated circuit oscillates the resonator to generate an oscillation signal. The oscillation signal is output from the external terminal of the oscillator 410 to the controllers 420, 430, and 440, and is used as, for example, a clock signal.

The battery 450 supplies power to the oscillator 410 and the controllers 420, 430, and 440. The backup battery 460 supplies power to the oscillator 410 and the controllers 420, 430, and 440 when the output voltage of the battery 450 becomes lower than a threshold.

The semiconductor integrated circuit 1 of each of the above-mentioned embodiments may be applied as the semiconductor integrated circuit included in the oscillator 410. Thereby, it is possible to reduce the possibility that the MOS transistor is broken by external noise. As a result, it is possible to realize a vehicle with high reliability.

As such a vehicle 400, various vehicles can be considered, and include, for example, a vehicle such as an electric vehicle, an aircraft such as a jet plane or a helicopter, a ship, a rocket, a satellite, and the like.

The present disclosure is not limited to the present embodiment, and various modifications can be made within the scope of the present disclosure.

The above-mentioned embodiments and modification examples are examples, and are not necessarily limited to those. For example, it is also possible to appropriately combine each embodiment and each modification example.

The disclosure includes configurations substantially the same as the configurations described in the embodiments, for example, configurations having the same function, method and result, or configurations having the same purpose and effect. Further, the present disclosure includes configurations in which a nonessential part of the configuration described in the embodiment is replaced. Further, the present disclosure also includes configurations that can achieve the same effects as the configurations described in the embodiments or that can achieve the same purpose. Further, the present disclosure includes configurations in which a known technology is added to the configurations described in the embodiments.

What is claimed is:

1. A semiconductor integrated circuit comprising:
an external terminal supplying a first power supply voltage;
a power supply circuit configured to generate a second power supply voltage greater than the first power supply voltage;
a semiconductor substrate; and
a first MOS transistor, a second MOS transistor and a P+ region that are provided on the semiconductor substrate, wherein
the first MOS transistor is an NMOS transistor which has a first N-type region and a second N-type region and in which the first N-type region is electrically connected to the external terminal and is supplied with the first power supply voltage,
the second MOS transistor is an NMOS transistor which has a third N-type region and a fourth N-type region and in which the third N-type region is electrically connected to the power supply circuit and is supplied with the second power supply voltage,
the P+ region is supplied with the first power supply voltage, and
in plan view of the semiconductor substrate,
the first MOS transistor and the second MOS transistor are disposed to be adjacent to each other, and
the P+ region is located between the first N-type region and the third N-type region.

2. The semiconductor integrated circuit according to claim 1, wherein
in plan view of the semiconductor substrate,
the fourth N-type region is located between the first N-type region and the third N-type region.

3. A semiconductor integrated circuit comprising:
an external terminal supplying a first power supply voltage;
a power supply circuit configured to generate a second power supply voltage greater than the first power supply voltage;
a semiconductor substrate; and
a first MOS transistor and a second MOS transistor that are provided on the semiconductor substrate, wherein
the first MOS transistor is an NMOS transistor which has a first N-type region and a second N-type region and in which the first N-type region is electrically connected to the external terminal and is supplied with the first power supply voltage,
the second MOS transistor is an NMOS transistor which has a third N-type region and a fourth N-type region and in which the third N-type region is electrically connected to the power supply circuit and is supplied with the second power supply voltage, and
in plan view of the semiconductor substrate,
the first MOS transistor and the second MOS transistor are disposed to be adjacent to each other, and
the fourth N-type region is located between the first N-type region and the third N-type region.

4. The semiconductor integrated circuit according to claim 1, wherein
the power supply circuit is configured to generate a third power supply voltage greater than the first power supply voltage,
the semiconductor integrated circuit further comprises a third MOS transistor and a fourth MOS transistor that are provided on the semiconductor substrate,
the third MOS transistor is an NMOS transistor which has a fifth N-type region and a sixth N-type region and in which the fifth N-type region is electrically connected to the external terminal and is supplied with the first power supply voltage,
the fourth MOS transistor is an NMOS transistor which has a seventh N-type region and an eighth N-type region and in which the seventh N-type region is electrically connected to the power supply circuit and is supplied with the third power supply voltage, and
in plan view of the semiconductor substrate,
the first MOS transistor and the third MOS transistor are disposed to be adjacent to each other, and
the second MOS transistor and the fourth MOS transistor are disposed to be adjacent to each other, and
the first N-type region and the third N-type region are located between the fifth N-type region and the seventh N-type region.

5. A semiconductor integrated circuit comprising:
an external terminal supplying a first power supply voltage;
a power supply circuit configured to generate a second power supply voltage lesser than the first power supply voltage;
a semiconductor substrate; and
a first MOS transistor, a second MOS transistor and an N+ region that are provided on the semiconductor substrate wherein,
the first MOS transistor is a PMOS transistor which has a first P-type region and a second P-type region, and in which the first P-type region is electrically connected to the external terminal and is supplied with the first power supply voltage,
the second MOS transistor is a PMOS transistor which has a third P-type region and a fourth P-type region and in which the third P-type region is electrically connected to the power supply circuit and is supplied with the second power supply voltage,
the N+ region is supplied with the first power supply voltage, and
in plan view of the semiconductor substrate,
the first MOS transistor and the second MOS transistor are disposed to be adjacent to each other, and
the N+ region is located between the first P-type region and the third P-type region.

6. The semiconductor integrated circuit according to claim 5, wherein
in plan view of the semiconductor substrate,
the fourth P-type region is located between the first P-type region and the third P-type region.

7. A semiconductor integrated circuit comprising:
an external terminal supplying a first power supply voltage;
a power supply circuit configured to generate a second power supply voltage lesser than the first power supply voltage;
a semiconductor substrate; and
a first MOS transistor and a second MOS transistor that are provided on the semiconductor substrate, wherein
the first MOS transistor is a PMOS transistor which has a first P-type region and a second P-type region, and in which the first P-type region is electrically connected to the external terminal and is supplied with the first power supply voltage,
the second MOS transistor is a PMOS transistor which has a third P-type region and a fourth P-type region and in which the third P-type region is electrically connected to the power supply circuit and is supplied with the second power supply voltage, in plan view of the semiconductor substrate,
the first MOS transistor and the second MOS transistor are disposed to be adjacent to each other, and
the fourth P-type region is located between the first P-type region and the third P-type region.

8. The semiconductor integrated circuit according to claim 5, wherein
the power supply circuit configured to generate a third power supply voltage lesser than the first power supply voltage,
the semiconductor integrated circuit further comprises a third MOS transistor and a fourth MOS transistor that are provided on the semiconductor substrate,
the third MOS transistor is a PMOS transistor which has a fifth P-type region and a sixth P-type region and in which the fifth P-type region is electrically connected to the external terminal and is supplied with the first power supply voltage,
the fourth MOS transistor is a PMOS transistor which has a seventh P-type region and an eighth P-type region and in which the seventh P-type region is electrically connected to the power supply circuit and is supplied with the third power supply voltage,
in plan view of the semiconductor substrate,
the first MOS transistor and the third MOS transistor are disposed to be adjacent to each other, and
the second MOS transistor and the fourth MOS transistor are disposed to be adjacent to each other, and
the first P-type region and the third P-type region are located between the fifth P-type region and the seventh P-type region.

9. The semiconductor integrated circuit according to claim 1, further comprising:
a fifth MOS transistor; and
a sixth MOS transistor; wherein
an inverter circuit includes the first MOS transistor and the fifth MOS transistor, and
an analog switch circuit includes the second MOS transistor and the sixth MOS transistor.

10. An electronic device comprising the semiconductor integrated circuit according to claim 1.

11. A vehicle comprising the semiconductor integrated circuit according to claim 1.

* * * * *